US011480889B2

(12) United States Patent
Fujii et al.

(10) Patent No.: US 11,480,889 B2
(45) **Date of Patent: *Oct. 25, 2022**

(54) DEVELOPING CARTRIDGE HAVING ELECTRODE

(71) Applicant: Brother Kogyo Kabushiki Kaisha, Nagoya (JP)

(72) Inventors: Yasumasa Fujii, Chiryu (JP); Tsutomu Suzuki, Nagoya (JP); Hiroshi Igarashi, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/474,245

(22) Filed: Sep. 14, 2021

(65) Prior Publication Data

US 2021/0405550 A1 Dec. 30, 2021

Related U.S. Application Data

(63) Continuation of application No. 16/935,393, filed on Jul. 22, 2020, now Pat. No. 11,150,573, which is a (Continued)

(30) Foreign Application Priority Data

Jul. 9, 2012 (JP) ................................ 2012-154135

(51) Int. Cl.
*G03G 15/00* (2006.01)
*G03G 15/08* (2006.01)
(Continued)

(52) U.S. Cl.
CPC ....... *G03G 15/065* (2013.01); *G03G 15/0865* (2013.01); *G03G 21/1652* (2013.01); (Continued)

(58) Field of Classification Search
CPC ................................................ G03G 21/1652
(Continued)

(56) References Cited

U.S. PATENT DOCUMENTS 5,648,838 A 7/1997 Michlin et al.
6,122,470 A 9/2000 Kimura
(Continued)

FOREIGN PATENT DOCUMENTS

CN 1892485 A 1/2007
CN 101082799 A 12/2007
(Continued)

OTHER PUBLICATIONS

Decision of Rejection issued in related Chinese Patent Application No. 201910275498.5, dated Feb. 11, 2022.
(Continued)

*Primary Examiner* — William J Royer
(74) *Attorney, Agent, or Firm* — Merchant & Gould P.C.

(57) ABSTRACT

A developing cartridge includes a casing, a rotating member, and an electrode member. The casing may be configured to accommodate therein developer. The rotating member has a rotational shaft extending in an axial direction. The rotating member is configured to rotate about the rotational shaft and carries the developer thereon. The electrode member is configured to be electrically connected to the rotating member. The electrode member covers at least part of the rotational shaft from an orthogonal direction orthogonal to the axial direction and is arranged to confront the casing in the axial direction. The electrode member is configured to move in the orthogonal direction in accordance with a movement in the axial direction.

15 Claims, 11 Drawing Sheets

Related U.S. Application Data continuation of application No. 16/574,525, filed on Sep. 18, 2019, now Pat. No. 10,775,713, which is a continuation of application No. 16/165,195, filed on Oct. 19, 2018, now Pat. No. 10,444,659, which is a continuation of application No. 15/662,659, filed on Jul. 28, 2017, now Pat. No. 10,133,207, which is a continuation of application No. 15/196,571, filed on Jun. 29, 2016, now Pat. No. 9,733,589, which is a continuation of application No. 14/988,263, filed on Jan. 5, 2016, now Pat. No. 9,395,681, which is a continuation of application No. 14/593,161, filed on Jan. 9, 2015, now Pat. No. 9,261,857, which is a continuation-in-part of application No. PCT/JP2012/080827, filed on Nov. 29, 2012.

(51) Int. Cl.
*G03G 15/06* (2006.01)
*G03G 21/18* (2006.01)
*G03G 21/16* (2006.01)

(52) U.S. Cl.
CPC ..... *G03G 21/1676* (2013.01); *G03G 21/1867* (2013.01); *H05K 999/99* (2013.01)

(58) Field of Classification Search
USPC .................................................... 399/90, 119
See application file for complete search history.

(56) References Cited

U.S. PATENT DOCUMENTS

| | | | |
|---|---|---|---|
| 6,385,414 B1 | 5/2002 | Sato et al. | |
| 7,085,516 B2 | 8/2006 | Kawai et al. | |
| 7,136,603 B2 | 11/2006 | Kawai | |
| 7,536,130 B2 | 5/2009 | Yokoi | |
| 8,050,593 B2 | 11/2011 | Furuichi et al. | |
| 8,494,419 B2 | 7/2013 | Shiraki et al. | |
| 8,538,291 B2 | 9/2013 | Mori | |
| 8,577,244 B2 | 11/2013 | Takagi et al. | |
| 8,682,200 B2 | 3/2014 | Chadani et al. | |
| 8,682,216 B2 | 3/2014 | Handa et al. | |
| 9,037,032 B2 | 5/2015 | Takagi et al. | |
| 9,195,208 B2 | 11/2015 | Takagi et al. | |
| 9,201,389 B2 | 12/2015 | Takagi et al. | |
| 9,207,631 B2 | 12/2015 | Takagi et al. | |
| 9,213,305 B2 | 12/2015 | Takagi et al. | |
| 9,261,857 B2 | 2/2016 | Fujii et al. | |
| 9,268,295 B2 | 2/2016 | Takagi et al. | |
| 9,395,681 B2 | 7/2016 | Fujii et al. | |
| 9,568,856 B2 | 2/2017 | Takagi et al. | |
| 9,632,456 B2 | 4/2017 | Takagi et al. | |
| 9,733,589 B2 | 8/2017 | Fujii et al. | |
| 9,851,689 B2 | 12/2017 | Takagi et al. | |
| 10,133,207 B2 | 11/2018 | Fujii et al. | |
| 10,151,998 B2 | 12/2018 | Fujii | |
| 10,444,659 B2 | 10/2019 | Fujii et al. | |
| 10,649,363 B2 | 5/2020 | Fujii | |
| 10,775,713 B2 | 9/2020 | Fujii et al. | |
| 11,150,573 B2 * | 10/2021 | Fujii et al. ......... | G03G 21/1652 |
| 2003/0156848 A1 | 8/2003 | Kawai et al. | |
| 2005/0047814 A1 | 3/2005 | Kawai | |
| 2005/0047825 A1 | 3/2005 | Nakano et al. | |
| 2006/0029418 A1 | 2/2006 | Ishii et al. | |
| 2006/0029419 A1 | 2/2006 | Shiraki | |
| 2006/0029420 A1 | 2/2006 | Ishii et al. | |
| 2006/0029421 A1 | 2/2006 | Ishii et al. | |
| 2006/0029422 A1 | 2/2006 | Shiraki | |
| 2006/0029423 A1 | 2/2006 | Shiraki | |
| 2007/0009281 A1 | 1/2007 | Sato et al. | |
| 2007/0059018 A1 | 3/2007 | Tokuda | |
| 2007/0280745 A1 | 12/2007 | Takashima et al. | |
| 2008/0138118 A1 | 6/2008 | Imamura et al. | |
| 2008/0292356 A1 | 11/2008 | Furuichi et al. | |
| 2008/0298838 A1 | 12/2008 | Sato et al. | |
| 2011/0158685 A1 | 6/2011 | Takagi et al. | |
| 2011/0182627 A1 | 7/2011 | Shiraki et al. | |
| 2011/0236063 A1 | 9/2011 | Handa et al. | |
| 2011/0280620 A1 | 11/2011 | Chadani et al. | |
| 2013/0114972 A1 | 5/2013 | Takarada et al. | |
| 2013/0287425 A1 | 10/2013 | Takagi | |
| 2014/0037319 A1 | 2/2014 | Takagi et al. | |
| 2014/0050503 A1 | 2/2014 | Chadani et al. | |
| 2014/0294450 A1 | 10/2014 | Handa et al. | |
| 2015/0055986 A1 | 2/2015 | Takagi et al. | |
| 2015/0125175 A1 | 5/2015 | Fujii | |
| 2015/0160603 A1 | 6/2015 | Takagi et al. | |
| 2015/0160604 A1 | 6/2015 | Takagi et al. | |
| 2015/0160605 A1 | 6/2015 | Takagi et al. | |
| 2015/0160606 A1 | 6/2015 | Takagi et al. | |
| 2016/0124341 A1 | 5/2016 | Takagi et al. | |
| 2016/0179032 A1 | 6/2016 | Takagi et al. | |
| 2017/0146949 A1 | 5/2017 | Takagi et al. | |
| 2018/0107152 A1 | 4/2018 | Takagi et al. | |

FOREIGN PATENT DOCUMENTS

| | | |
|---|---|---|
| CN | 100462869 C | 2/2009 |
| CN | 102109792 A | 6/2011 |
| CN | 102141753 A | 8/2011 |
| CN | 104428721 A | 3/2015 |
| CN | 110161819 A | 8/2019 |
| CN | 110262202 A | 9/2019 |
| EP | 2343606 A1 | 7/2011 |
| JP | 2000-003092 A | 1/2000 |
| JP | 2001-100493 A | 4/2001 |
| JP | 2003-223091 A | 8/2003 |
| JP | 2005-070402 A | 3/2005 |
| JP | 2005-070407 A | 3/2005 |
| JP | 2005-215548 A | 8/2005 |
| JP | 2006-072285 A | 3/2006 |
| JP | 2008-292769 A | 12/2008 |
| JP | 2011-133767 A | 7/2011 |
| JP | 2011-154239 A | 8/2011 |
| JP | 2011-203367 A | 10/2011 |
| JP | 2011-257741 A | 12/2011 |
| JP | H08-6340 A | 5/2014 |
| WO | 2012/090907 A1 | 7/2012 |

OTHER PUBLICATIONS

Decision of Rejection issued in related Chinese Patent Application No. 201910275919.4, dated Feb. 14, 2022.
Decision of Rejection issued in related Chinese Patent Application No. 201910278221.8, dated Jul. 6, 2021.
Jan. 22, 2013—International Search Report—Intl App PCT/JP2012/080827.
Jan. 22, 2013—International Search Report—Intl App PCT/JP2012/080824.
Jan. 22, 2015—International Preliminary Report on Patentability—Intl App PCT/JP2012/080827.
Jan. 22, 2015—International Preliminary Report on Patentability—Intl App PCT/JP2012/080824.
Sep. 3, 2015—U.S. Non-Final Office Action—U.S. Appl. No. 14/593,123.
Dec. 1, 2015—(JP) Office Action—App 2012-154135.
Dec. 1, 2015—(JP) Office Action—App 2012-154132.
Dec. 21, 2015—U.S. Notice of Allowance—U.S. Appl. No. 14/593,123.
Feb. 2, 2016—(EP) Extended Search Report—App 12880909.2.
Mar. 17, 2016—U.S. Notice of Allowance—U.S. Appl. No. 14/593,123.
May 10, 2016—U.S. Notice of Allowance—U.S. Appl. No. 14/593,123.
May 19, 2016—(EP) Extended Search Report—App 12880728.6.
Sep. 21, 2016—U.S. Notice of Allowance—U.S. Appl. No. 15/075,434.
Sep. 15, 2017—U.S. Non-Final Office Action—U.S. Appl. No. 15/370,515.
Feb. 21, 2018—U.S. Non-Final Office Action—U.S. Appl. No. 15/370,515.
Apr. 4, 2018—(CN) Notification of First Office Action—App 201280074600.1.

(56) References Cited

OTHER PUBLICATIONS

Apr. 3, 2018—(CN) Notification of First Office Action—App 201280074634.0.
Jul. 23, 2018—U.S. Notice of Allowance—U.S. Appl. No. 15/370,515.
Jan. 9, 2019—U.S. Notice of Allowance—U.S. Appl. No. 16/180,408.
Feb. 14, 2019—(EP) Extended Search Report—App 18199929.3.
Apr. 4, 2019—U.S. Notice of Allowance Office Action—U.S. Appl. No. 16/290,326.
Jun. 4, 2019—U.S. Notice of Allowance—U.S. Appl. No. 16/180,408.
Jun. 12, 2019—U.S. Notice of Allowance—U.S. Appl. No. 16/290,326.
Oct. 18, 2019—U.S. Non-final Office Action—U.S. Appl. No. 16/578,756.
Jan. 13, 2020—U.S. Notice of Allowance—U.S. Appl. No. 16/578,756.
Jun. 18, 2020—U.S. Non-final Office Action—U.S. Appl. No. 16/867,079.
Jul. 1, 2020—U.S. Notice of Allowance—U.S. Appl. No. 16/867,129.
Jul. 21, 2020—(EP) Extended Search Report—App 20160718.1.
Sep. 1, 2020—U.S. Notice of Allowance—U.S. Appl. No. 16/867,079.
Office Action issued in related German Patent Application No. 11 2012 006 676.6, dated Apr. 7, 2021.
Office Action issued in related Chinese Patent Application No. 201910278221.8, dated Apr. 14, 2021.
Office Action issued in related Chinese Patent Application No. 201910275498.5, dated Apr. 27, 2021.
Office Action issued in related Chinese Patent Application No. 201910275919.4, dated May 6, 2021.

* cited by examiner

DEVELOPING CARTRIDGE HAVING ELECTRODE

CROSS REFERENCE TO RELATED APPLICATION

This application is a continuation of U.S. patent application Ser. No. 16/935,393, filed Jul. 22, 2020, which is a continuation of U.S. patent application Ser. No. 16/574,525 filed Sep. 18, 2019, which is a continuation of U.S. patent application Ser. No. 16/165,195 filed Oct. 19, 2018, issued as U.S. Pat. No. 10,444,659 on Oct. 15, 2019 which is a continuation of U.S. patent application Ser. No. 15/662,659 filed Jul. 28, 2017, issued as U.S. Pat. No. 10,133,207 on Nov. 20, 2018, which is a continuation of U.S. patent application Ser. No. 15/196,571 filed Jun. 29, 2016, issued as U.S. Pat. No. 9,733,589 on Aug. 15, 2017, which is a continuation of U.S. patent application Ser. No. 14/988,263, filed Jan. 5, 2016, issued as U.S. Pat. No. 9,395,681 on Jul. 19, 2016, which is a continuation of U.S. patent application Ser. No. 14/593,161 filed Jan. 9, 2015, issued as U.S. Pat. No. 9,261,857 on Feb. 16, 2016, which claims priority from Japanese Patent Application 2012-154135 filed Jul. 9, 2012. This application is also a continuation-in-part of International Application No. PCT/JP2012/080827 filed Nov. 29, 2012 in Japan Patent Office as a Receiving Office. The contents of these applications are incorporated herein by reference.

TECHNICAL FIELD

The present invention relates to a developing cartridge adapted to be mounted on an image forming device that employs an electrophotographic system.

BACKGROUND

An image-forming device disclosed in Japanese Patent Application Publication No. 2006-72285 employs an electrophotographic system. The image-forming device has a developing cartridge that is configured to be detachably mounted in a device body for supplying developer to a photosensitive drum.

One such developing cartridge that has been proposed is provided with a developing roller that carries toner, a supply roller that supplies toner to the developing roller, and a collar member that covers and is electrically connected to a developing-roller shaft of the developing roller and a supply-roller shaft of the supply roller.

This developing cartridge is mounted in the device body of the image-forming device after being mounted in a drum cartridge having the photosensitive drum.

SUMMARY

However, when the developing cartridge described above is mounted in the drum cartridge, the collar member is fixed in position by fitting the portion of the collar member covering the end of the developing-roller shaft in a roller-shaft receiving part of the drum cartridge.

Further, when the developing cartridge is mounted in the device body of the image-forming device, a developing-roller contact in the device body contacts the collar member (the portion that covers the end of the developing roller shaft) that is fixed in position relative to the drum cartridge from the outside with respect to the axial direction of the developing roller.

Hence, while this configuration can ensure an electrical connection between the developing-roller contact in the device body and the collar member, the ability of the collar member to follow the developing-roller shaft may be reduced.

When the collar member is less able to follow the developing-roller shaft, the electrical connection between the collar member and the developing-roller shaft or supply-roller shaft may be less reliable.

Therefore, it is an object of the present invention to provide a developing cartridge capable of improving the reliability of the electrical connection formed between an electrode member and a rotational shaft.

In order to solve the above problem, the present invention provides a developing cartridge. The developing cartridge may include a casing, a rotating member, and an electrode member. The casing may be configured to accommodate therein developer. The rotating member may have a rotational shaft extending in an axial direction. The rotating member may be configured to rotate about the rotational shaft and carries the developer thereon. The electrode member may be configured to be electrically connected to the rotating member. The electrode member may cover at least part of the rotational shaft from an orthogonal direction orthogonal to the axial direction and be arranged to confront the casing in the axial direction. The electrode member may be configured to move in the orthogonal direction in accordance with a movement in the axial direction.

DETAILED DESCRIPTION

1. Printer

Figure 1:
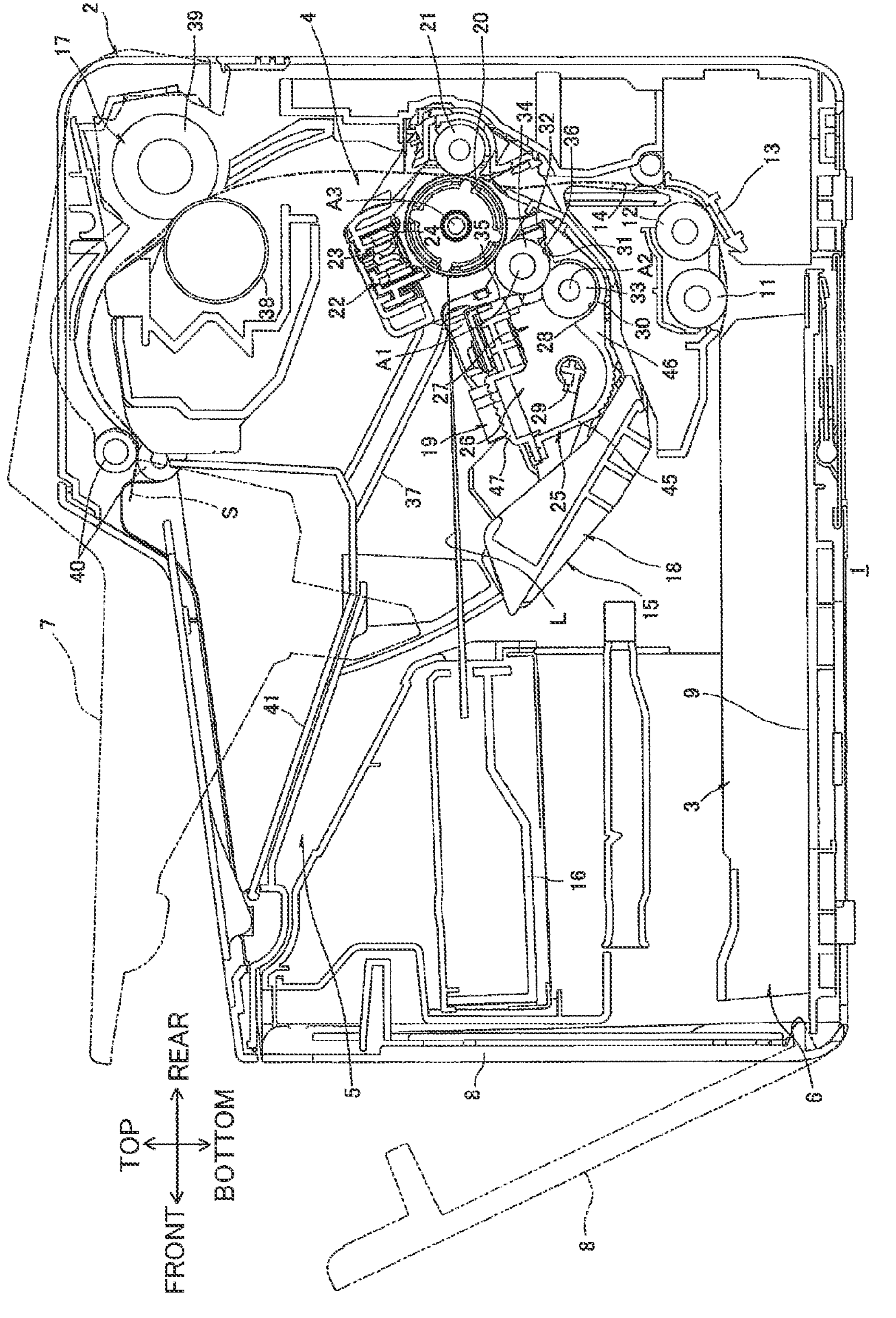
FIG. 1 is a central cross-sectional view of a printer in which a developing cartridge is mounted according to one embodiment of the present invention.

As shown in FIG. 1, a printer 1 is provided with a main casing 2 having a box-like shape.

Within the main casing 2, the printer 1 is also provided with a sheet-feeding unit 3 for feeding sheets S of paper, and an image-forming unit 4 for forming images on the sheets S supplied by the sheet-feeding unit 3.

Directions related to the printer 1 will be specified based on the orientation of the printer 1 when resting on a level surface, and specifically will refer to the directions indicated by arrows in FIG. 1.

(1) Main Casing

The main casing 2 is formed with a cartridge access opening 5 for mounting and removing a process cartridge 15 (described later), and a paper-introducing opening 6 through which the sheets S are inserted into the main casing 2.

The cartridge access opening 5 is formed in the top portion of the main casing 2 and penetrates the main casing 2 in the top-bottom direction.

The paper-introducing opening 6 is formed in the front side of the main casing 2 at the bottom portion thereof and penetrates the front side in the front-rear direction.

The main casing 2 also includes a top cover 7 disposed on the top portion thereof, and a sheet-feeding cover 8 disposed on the front thereof. The top cover 7 is provided with a discharge tray 41 into which sheets S are discharged.

The top cover 7 is disposed so as to be capable of pivoting (moving) about its rear edge between a closed position for covering the cartridge access opening 5, and an open position for exposing the cartridge access opening 5.

The sheet-feeding cover 8 is disposed so as to be capable of pivoting (moving) about its bottom edge between a first position for covering the paper-introducing opening 6, and a second position for exposing the paper-introducing opening 6.

(2) Sheet-Feeding Unit

The sheet-feeding unit 3 includes a sheet-supporting part 9 provided in the bottom portion of the main casing 2.

The sheet-supporting part 9 is in communication with the exterior of the main casing 2 through the paper-introducing opening 6.

When the sheet-feeding cover 8 is in the second position, sheets S of paper are inserted into the sheet-feeding unit 3 through the paper-introducing opening 6 such that the rear portions of the sheets S are stacked on the sheet-supporting part 9 and the front portions of the sheets S are stacked on the top surface of the sheet-feeding cover 8.

The sheet-feeding unit 3 further includes a pickup roller 11 disposed above the rear edge of the sheet-supporting part 9, a feeding roller 12 disposed on the rear side of the pickup roller 11, a feeding pad 13 arranged so as to confront the lower rear side of the feeding roller 12, and a feeding path 14 extending continuously upward from the rear edge of the feeding pad 13.

(3) Image-Forming Unit

The image-forming unit 4 includes the process cartridge 15, a scanning unit 16, and a fixing unit 17.

(3-1) Process Cartridge

The process cartridge 15 can be mounted in and removed from the main casing 2. When mounted in the main casing 2, the process cartridge 15 is arranged above the rear portion of the sheet-feeding unit 3.

The process cartridge 15 includes a drum cartridge 18, and a developing cartridge 19. The drum cartridge 18 is detachably mountable in the main casing 2. The developing cartridge 19 is detachably mountable in the drum cartridge 18.

The drum cartridge 18 includes a photosensitive drum 20, a transfer roller 21, and a scorotron charger 22.

The photosensitive drum 20 is formed in a general cylindrical shape that is elongated in the left-right direction (axial direction). The photosensitive drum 20 is rotatably provided in the rear region of the drum cartridge 18. The photosensitive drum 20 is also provided with a drum shaft A3 that extends along the central axis of the photosensitive drum 20 in the left-right direction. The photosensitive drum 20 is rotatably supported on the left and right walls of the drum cartridge 18 at the corresponding left and right ends of the drum shaft A3. The left and right ends of the drum shaft A3 penetrate the side walls of the drum cartridge 18 and protrude outward therefrom in the left-right direction.

The transfer roller 21 is formed in a general columnar shape that is elongated in the left-right direction. The transfer roller 21 is in pressure contact with the rear side of the photosensitive drum 20.

More specifically, the transfer roller 21 is disposed on the rear side of the photosensitive drum 20 with its central axis positioned slightly lower than the central axis of the photosensitive drum 20. Note that the bottom surface of the transfer roller 21 is higher than the bottom surface of the photosensitive drum 20. That is, a virtual line segment (not shown) connecting the central axis of the transfer roller 21 to the central axis of the photosensitive drum 20 forms an acute angle of approximately 3° with a virtual line (not shown) extending horizontally in the front-rear direction. Accordingly, the weight of the transfer roller 21 does not affect the pressure with which the transfer roller 21 contacts the photosensitive drum 20 (transfer pressure).

The scorotron charger 22 is arranged to confront the upper front side of the photosensitive drum 20 with a gap therebetween.

The scorotron charger 22 is disposed at a position separated from the transfer roller 21 in the circumferential direction of the photosensitive drum 20. More specifically, the scorotron charger 22 is disposed such that a virtual line segment (not shown) connecting the central axis of the photosensitive drum 20 with the central axis of the transfer roller 21 forms an angle of approximately 120° with a virtual line segment (not shown) connecting the central axis of the photosensitive drum 20 with a charging wire 23 (described later).

The scorotron charger 22 further includes the charging wire 23, and a grid 24.

The charging wire 23 is stretched in a taut state to extend in the left-right direction and is disposed so as to confront but remain separated from the upper front side of the photosensitive drum 20.

The grid 24 is formed to have a general angular U-shape in a side view and is formed with the opening of the "U" facing diagonally upward and forward so as to surround the charging wire 23 from the lower rear side.

The developing cartridge 19 is disposed on the lower front side of the photosensitive drum 20. The developing cartridge 19 includes a developing-cartridge frame 25 as an example of a casing.

The developing-cartridge frame 25 defines therein a toner-accommodating chamber 26 and a development chamber 27. The toner-accommodating chamber 26 and the development chamber 27 are provided side by side in the front-rear direction, with a communication opening 28 allowing communication therebetween. The toner-accommodating chamber 26 and the development chamber 27 have substantially the same capacity.

The toner-accommodating chamber 26 accommodates therein toner (developer). An agitator 29 is provided in the approximate front-rear and vertical center region of the toner-accommodating chamber 26. In other words, the agitator 29 is positioned lower than the photosensitive drum 20.

In the development chamber 27, a bottom wall 46 (described later) has a top surface formed with a supply-roller groove 30, a developing-roller opposing surface 31, and a lower-film adhering surface 32.

The supply-roller groove 30 is formed in a general semicircular shape conforming to the circumferential surface of a supply roller 33 (described later), with the convex shape of the supply-roller groove 30 depressed obliquely downward and rearward.

The developing-roller-opposing surface 31 is formed in a general arc shape that conforms to the circumferential surface of a developing roller 34 (described later). The developing-roller opposing surface 31 extends continuously from the rear edge of the supply-roller groove 30 toward the upper rear side.

The lower-film adhering surface 32 is formed continuously with the rear edge of the developing-roller opposing surface 31 and extends rearward therefrom. Thus, the lower-film adhering surface 32 is arranged higher than the developing-roller opposing surface 31.

The lower-film adhering surface 32 is also arranged so as to confront the bottom portion of the photosensitive drum 20 in the top-bottom direction, with a gap therebetween. The lower-film adhering surface 32 is arranged to overlap the central axis of the photosensitive drum 20 when projected vertically.

The supply roller 33 as an example of a rotating member (the rotating member capable of carrying developer thereon), the developing roller 34, a thickness-regulating blade 35, and a lower film 36 are provided in the development chamber 27.

The supply roller 33 is formed in a general columnar shape that is elongated in the left-right direction. The supply roller 33 is provided in the front region of the development chamber 27 with its bottom portion disposed in the supply-roller groove 30. The supply roller 33 is capable of rotating about its central axis. With this configuration, the supply roller 33 is disposed on the rear side of the toner-accommodating chamber 26 and is arranged at the same approximate height as the toner-accommodating chamber 26, i.e., slightly higher than the toner-accommodating chamber 26.

The developing roller 34 is formed in a general columnar shape that is elongated in the left-right direction. The developing roller 34 is provided in the rear region of the development chamber 27 such that the bottom circumferential surface of the developing roller 34 opposes the developing-roller opposing surface 31 with a gap therebetween. The developing roller 34 is capable of rotating about its central axis (rotational shaft).

The developing roller 34 is also disposed so as to contact the upper rear side of the supply roller 33 and so that the upper rear side surfaces of the developing roller 34 are exposed outside the development chamber 27 and contact the lower front surface of the photosensitive drum 20. In other words, the developing roller 34 is arranged on the upper rear side of the supply roller 33 and the lower front side of the photosensitive drum 20. The central axes of the supply roller 33, the developing roller 34, and the photosensitive drum 20 are positioned along substantially the same line following a radial direction of the photosensitive drum 20.

The developing roller 34 is also disposed in a position separated from the scorotron charger 22 in the circumferential direction of the photosensitive drum 20. More specifically, the developing roller 34 is arranged such that a virtual line segment (not shown) connecting the central axis of the photosensitive drum 20 to the charging wire 23 forms an angle of approximately 120° with a virtual line segment (not shown) connecting the central axis of the photosensitive drum 20 to the central axis of the developing roller 34. Hence, the developing roller 34, the scorotron charger 22, and the transfer roller 21 are arranged at substantially equal intervals along the circumferential direction of the photosensitive drum 20.

The top edge of the thickness-regulating blade 35 is fixed to the rear edge of the top wall defining the development chamber 27. The bottom edge of the thickness-regulating blade 35 contacts the developing roller 34 from the front side thereof.

The rear portion of the lower film 36 is fixed to the lower-film adhering surface 32. The front edge of the lower film 36 contacts the circumferential surface of the developing roller 34 above the developing-roller opposing surface 31.

(3-2) Scanning Unit

The scanning unit 16 is arranged on the front side of the process cartridge 15 in a position opposing but separated from the photosensitive drum 20 in the front-rear direction.

The scanning unit 16 irradiates a laser beam L toward the photosensitive drum 20 based on image data, thereby exposing the circumferential surface of the photosensitive drum 20.

More specifically, the scanning unit 16 irradiates the laser beam L rearward to expose the circumferential surface of the photosensitive drum 20 on the front side thereof. In other words, the exposure point at which the photosensitive drum 20 is exposed (the circumferential surface on the front side of the photosensitive drum 20) is configured to be on the opposite side of the nip part, where the photosensitive drum 20 and transfer roller 21 contact each other, with respect to the central axis of the photosensitive drum 20.

At this time, the developing cartridge 19 is arranged beneath the path of the irradiated laser beam L, while the scorotron charger 22 is disposed above the path of the irradiated laser beam L.

The main casing 2 has inner surfaces provided with guide parts 37 positioned at the space between the scanning unit 16 and the photosensitive drum 20 for guiding mounting and removal of the process cartridge 15. When removing the process cartridge 15 from the main casing 2, the guide parts 37 guide the process cartridge 15 so that the developing cartridge 19 mounted in the drum cartridge 18 moves upward, passing from the bottom side of the irradiation path on the laser beam L to the top side thereof.

At this time, various rollers provided in the process cartridge 15 (the transfer roller 21, the supply roller 33, and the developing roller 34) also pass upward through the irradiation path of the laser beam L.

(3-3) Fixing Unit

The fixing unit 17 is disposed above the rear portion of the drum cartridge 18. More specifically, the fixing unit 17 includes a heating roller 38 disposed above the scorotron charger 22, and a pressure roller 39 that is in pressure contact with the upper rear side of the heating roller 38.

Hence, the heating roller 38 is disposed near the upper edge (open side edge) of the grid 24 in the scorotron charger 22.

(4) Image-Forming Operation

The agitator 29 rotates to supply toner from the toner-accommodating chamber 26 of the developing cartridge 19 to the supply roller 33 through the communication opening 28. The supply roller 33 in turn supplies the toner onto the developing roller 34, at which time the toner is positively tribocharged between the supply roller 33 and the developing roller 34.

The thickness-regulating blade 35 regulates the thickness of toner supplied to the developing roller 34 as the developing roller 34 rotates so that a thin layer of toner having uniform thickness is carried on the surface of the developing roller 34.

In the meantime, the scorotron charger 22 uniformly charges the surface of the photosensitive drum 20. The scanning unit 16 subsequently exposes the surface of the photosensitive drum 20, forming an electrostatic latent image on the circumferential surface of the photosensitive drum 20 based on image data. Next, the toner carried on the developing roller 34 is supplied to the electrostatic latent image on the circumferential surface of the photosensitive drum 20 so that a toner image (developer image) is carried on the circumferential surface of the photosensitive drum 20.

The rotating pickup roller 11 supplies sheets S stacked on the sheet-supporting part 9 between the feeding roller 12 and the feeding pad 13, and the rotating feeding roller 12 separates the sheets S, conveys each separated sheet S onto the feeding path 14, and supplies the sheets S one at a time to the image-forming unit 4 (between the photosensitive drum 20 and the transfer roller 21) at a prescribed timing.

Each sheet S is conveyed upward between the photosensitive drum 20 and the transfer roller 21, at which time the toner image is transferred from the photosensitive drum 20 onto the sheet S, forming an image on the sheet S.

Next, the sheet S passes between the heating roller 38 and the pressure roller 39. At this time, the heating roller 38 and the pressure roller 39 apply heat and pressure to the sheet S to thermally fix the image to the sheet S.

The sheet S is subsequently conveyed toward discharge rollers 40. The discharge rollers 40 discharge the sheet S onto the discharge tray 41 formed on the top surface of the main casing 2.

In this way, the sheet S is supplied from the sheet-supporting part 9 and conveyed along a conveying path that has a general C-shape in a side view, passing first between the photosensitive drum 20 and the transfer roller 21 (the nip part) and next between the heating roller 38 and the pressure roller 39, and subsequently being discharged onto the discharge tray 41.

2. Developing Cartridge

Figure 2:
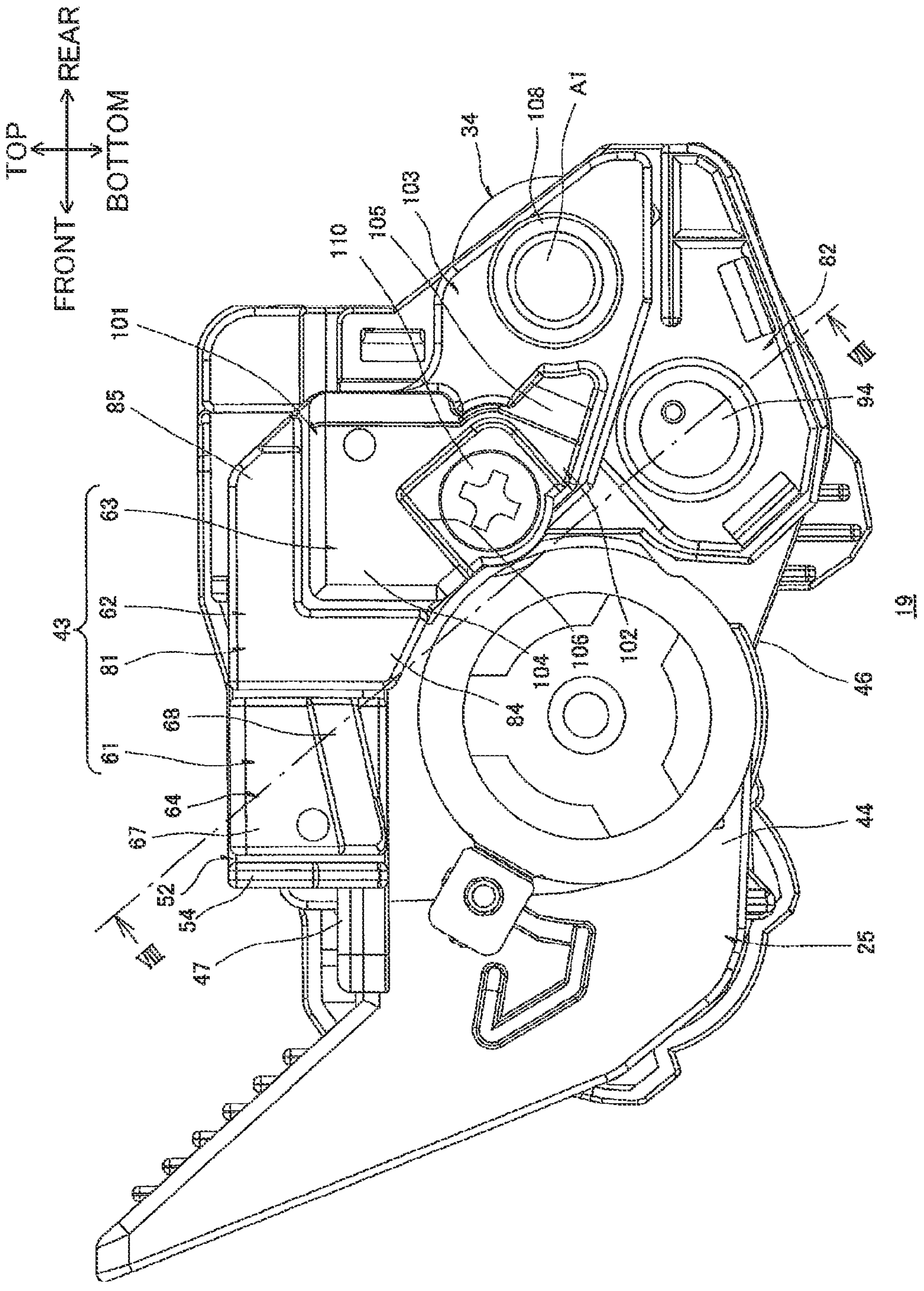
FIG. 2 is a right side view of the developing cartridge shown in FIG. 1.
Figure 3:
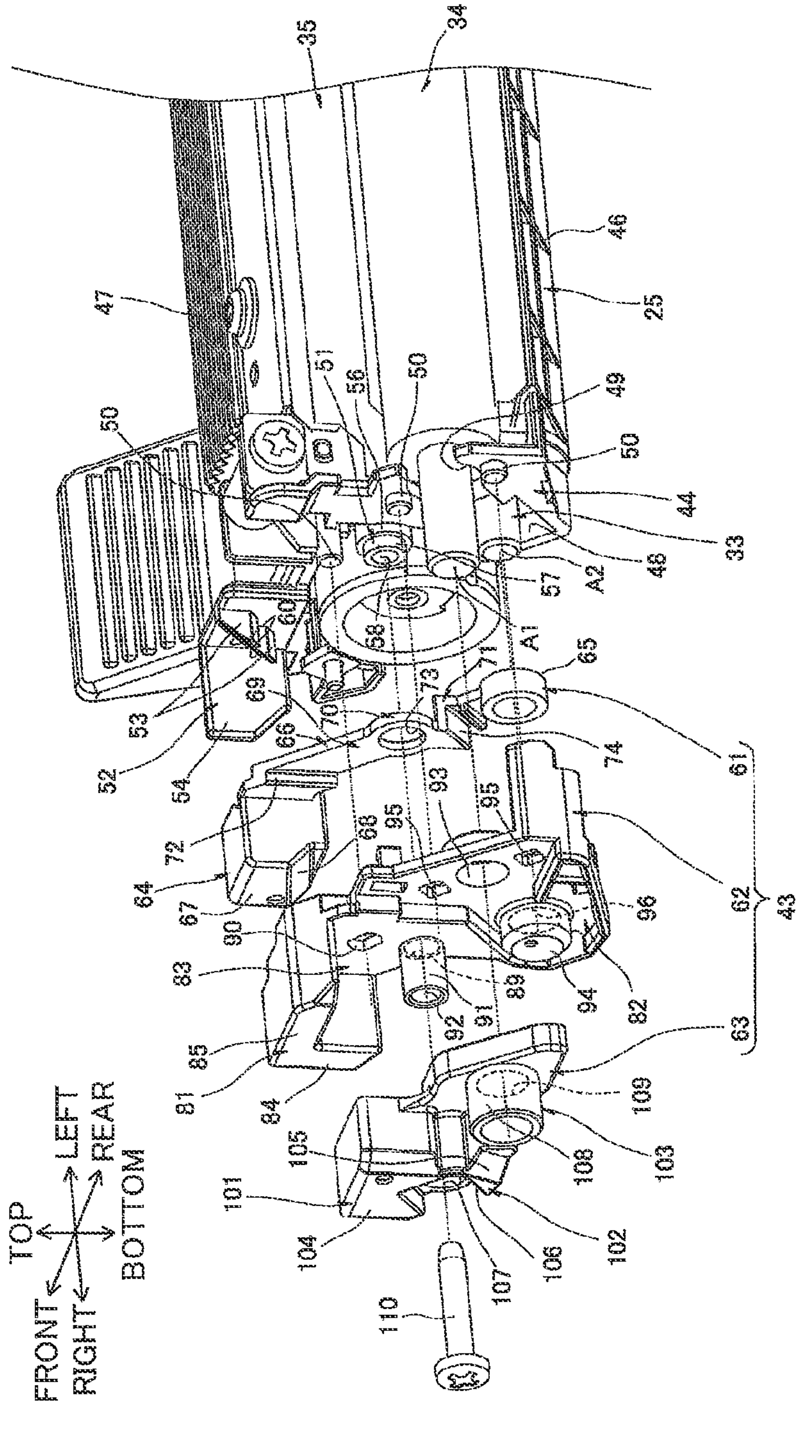
FIG. 3 is an exploded perspective view of a power supply unit provided on the developing cartridge shown in FIG. 2 as viewed from right and rear.

As shown in FIGS. 2 and 3, the developing cartridge 19 includes the developing-cartridge frame 25 described above, and a power supply unit 43 provided on the right side (as an example of the second direction) of the developing-cartridge frame 25.

A drive unit (not shown) is provided on the left side (as an example of the first direction) of the developing-cartridge frame 25 and has a gear train (not shown) that receives a drive force inputted from the main casing 2. Further, the following description will include a detailed description of the structure related to power supply for the developing cartridge 19 (the structure on the right side of the developing cartridge 19), but will omit a description of the structure related to the drive force inputted into the developing cartridge 19 (the structure on the left side of the developing cartridge 19).

Further, in the following description of the developing cartridge 19, descriptions related to the developing cartridge 19 will be given under the assumption that the side of the developing cartridge 19 in which the developing roller 34 is provided is the rear side, and the side in which the thickness-regulating blade 35 is provided is the top. That is, the top, bottom, front, and rear directions related to the developing cartridge 19 differ slightly from the top, bottom, front, and rear directions related to the printer 1. When the developing cartridge 19 is mounted in the printer 1, the rear side of the developing cartridge 19 faces the upper rear side of the printer 1, and the front side of the developing cartridge 19 faces the lower front side of the printer 1.

(1) Developing-Cartridge Frame

Figure 4:
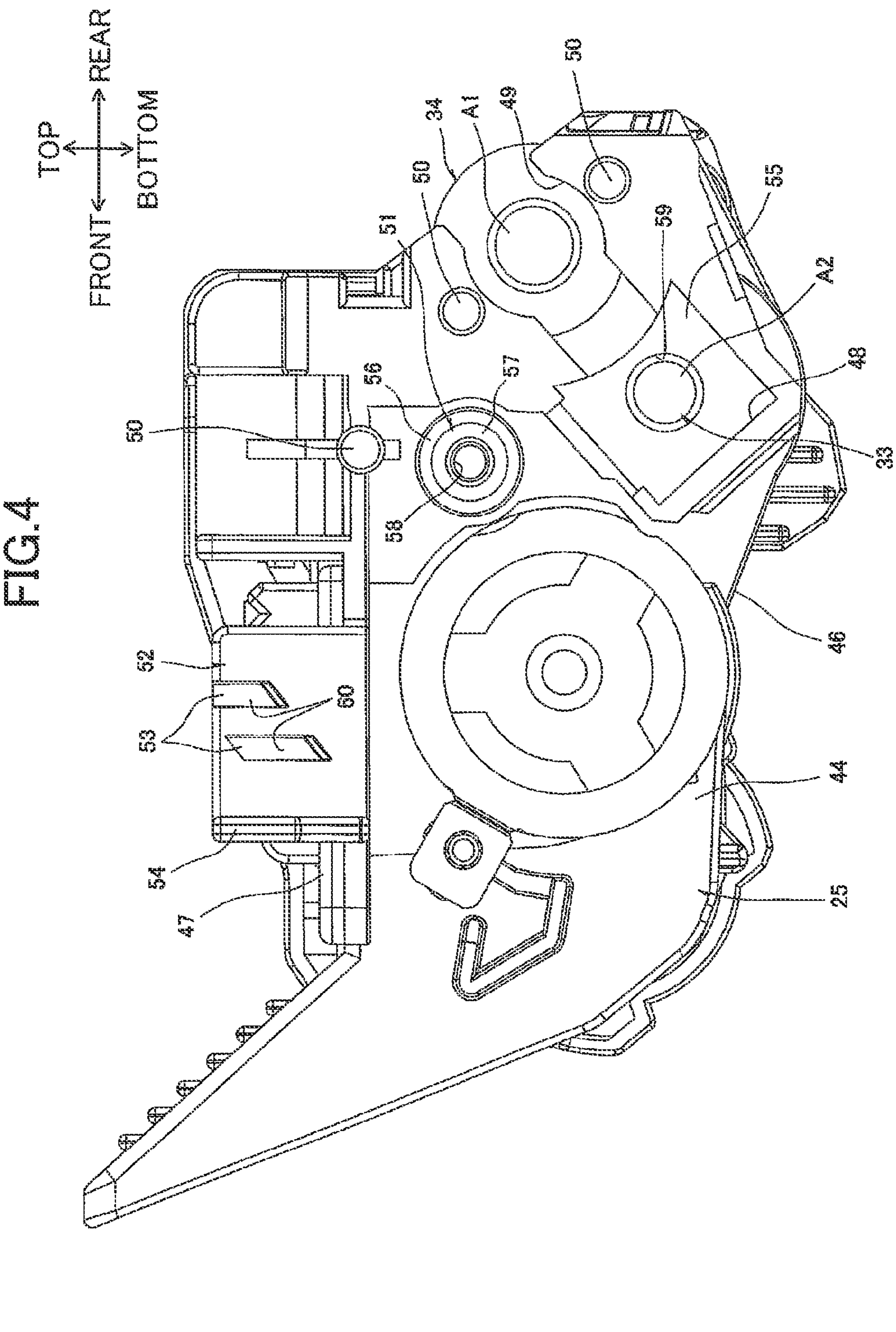
FIG. 4 is a right side view of a cartridge frame shown in FIG. 3.

As shown in FIGS. 3 and 4, the developing-cartridge frame 25 is formed with a box-like shape that is elongated in the left-right direction and is open on the rear side. More specifically, the developing-cartridge frame 25 includes a right wall 44, a left wall (not shown), a front wall 45 (see FIG. 1), a bottom wall 46, and a top wall 47.

The right wall 44 and the left wall (not shown) are formed with a general rectangular shape in a side view that is elongated in the vertical and front-rear directions. The right wall 44 and the left wall are disposed on opposing sides of the developing-cartridge frame 25 in the left-right direction. Each of the right wall 44 and the left wall are formed with a developing-roller-shaft exposing hole 49 and a supply-roller-shaft exposing hole 48.

The developing-roller-shaft exposing holes 49 are formed in the rear ends of the right wall 44 and the left wall (not shown) in the approximate vertical center region thereof. The developing-roller-shaft exposing holes 49 have a general circular shape in a side view and penetrate the right wall 44 and the left wall in the left-right direction. The diameter of the developing-roller-shaft exposing holes 49 is greater than the outer diameter of the rotational shaft in the developing roller 34 (hereinafter called the developing-roller shaft A1). The developing-roller-shaft exposing holes 49 are also open on the upper rear side.

The supply-roller-shaft exposing holes 48 are formed near the bottom end portions of the corresponding right wall 44 and the left wall (not shown) and are positioned on the lower front sides of the respective developing-roller-shaft exposing holes 49. The supply-roller-shaft exposing holes 48 are formed in a general rectangular shape in a side view and penetrate the right wall 44 and the left wall in the left-right direction. The dimensions of the supply-roller-shaft exposing holes 48 are greater than the outer diameter of the rotational shaft in the supply roller 33 (hereinafter called the supply-roller shaft A2). Further, the upper rear sides of the supply-roller-shaft exposing holes 48 are in communication with the lower front sides of the corresponding developing-roller-shaft exposing holes 49. Each of the supply-roller-shaft exposing holes 48 is provided with a shaft seal 55 (as an example of an elastic member) fitted therein.

The shaft seal 55 is formed of a resinous sponge or the like having an elasticity. The shaft seal 55 has a general square columnar shape that is substantially rectangular in a side view and has a slightly larger outer dimension than the dimensions of the supply-roller-shaft exposing hole 48. A through-hole 59 having a slightly smaller diameter than the outer diameter of the supply-roller shaft A2 is formed at the approximate center of the shaft seal 55 when viewed from the side. The supply-roller shaft A2 is inserted into the through-hole 59.

The left and right ends of the developing-roller shaft A1 are exposed on the outer left-right sides of the corresponding right wall 44 and the left wall (not shown) through the developing-roller-shaft exposing holes 49. The left and right ends of the supply-roller shaft A2 are exposed on the outer left-right sides of the right wall 44 and the left wall through the corresponding supply-roller-shaft exposing holes 48. Note that the left ends of the developing-roller shaft A1 and the supply-roller shaft A2 are coupled to a gear train (not shown) of the drive unit (not shown) so that the drive unit can transmit a drive force to the developing-roller shaft A1 and the supply-roller shaft A2.

The right wall 44 is also provided with a plurality of (three) positioning protrusions 50, a threaded part 51, and a supply-electrode opposing part 52 (as an example of a second end portion).

The positioning protrusions 50 are arranged with one positioning protrusion 50 on the lower rear side of the developing-roller-shaft exposing hole 49, one on the upper front side of the developing-roller-shaft exposing hole 49, and one above the threaded part 51. The positioning protrusions 50 are formed in a general columnar shape and protrude rightward from the right surface of the right wall 44.

The threaded part 51 is disposed above the supply-roller-shaft exposing hole 48. The threaded part 51 is integrally provided with a large-diameter part 56, and a small-diameter part 57.

The large-diameter part 56 is formed in a general cylindrical shape and protrudes rightward from the right surface of the right wall 44.

The small-diameter part 57 is formed in a general cylindrical shape that is coaxial with the large-diameter part 56 and protrudes rightward from the right surface of the large-diameter part 56. The inner diameter of the small-diameter part 57 is equivalent to the inner diameter of the large-diameter part 56, while the outer diameter of the small-diameter part 57 is smaller than the outer diameter of the large-diameter part 56.

The large-diameter part 56 and the small-diameter part 57 share an inner circumferential surface 58 on which a thread ridge is formed continuously across both the large-diameter part 56 and the small-diameter part 57.

The supply-electrode opposing part 52 is formed in a plate shape that is generally rectangular in a side view and that extends upward from the top edge of the right wall 44 in the approximate front-rear center thereof. The supply-electrode opposing part 52 includes a plurality of (two) ridges 53, and a protection wall 54.

The ridges 53 are formed in a plate shape having a general triangular shape in a front view, with its apex oriented rightward so as to protrude rightward from the approximate front-rear center of the supply-electrode opposing part 52. Each of the ridges 53 has a right surface 60 (as an example of a sloped surface) that slopes in a direction downward and rearward toward the right side. Further, the ridges 53 are arranged parallel to each other and are spaced apart in a diagonal direction between the lower front side and the upper rear side. The right surfaces 60 of the plurality of ridges 53 are provided on the same virtual plane. That is, the virtual plane that is an extended plane of the right surface 60 on the lower front ridge 53 is the same virtual plane that is an extended plane of the right surface 60 on the upper rear ridge 53.

The protection wall 54 is formed in a plate shape that is generally rectangular in a rear side view and extends rightward from the front edge of the supply-electrode opposing part 52 at the front side of the ridges 53.

The front wall 45 (see FIG. 1) has a general plate shape that is elongated in the left-right direction. The front wall 45 integrally bridges the front edges of the right wall 44 and the left wall (not shown).

The bottom wall 46 is formed in a general plate shape that is elongated in the left-right direction. The bottom wall 46 extends continuously rearward from the bottom edge of the front wall 45 and integrally bridges the bottom edges of the right wall 44 on the left wall (not shown).

The top wall 47 is formed in a general plate shape that is elongated in the left-right direction and is arranged in opposition to the top edges of the front wall 45, the right wall 44, and the left wall (not shown). The peripheral edges of the top wall 47 are fixed to the top edges of the front wall 45, the right wall 44, and the left wall through welding or another method.

(2) Power Supply Unit

As shown in FIGS. 2 and 3, the power supply unit 43 includes a supply electrode 61 as an example of an electrode member, a bearing member 62 as an example of a pressing member, and a developing electrode 63.

(2-1) Supply Electrode

Figure 5:
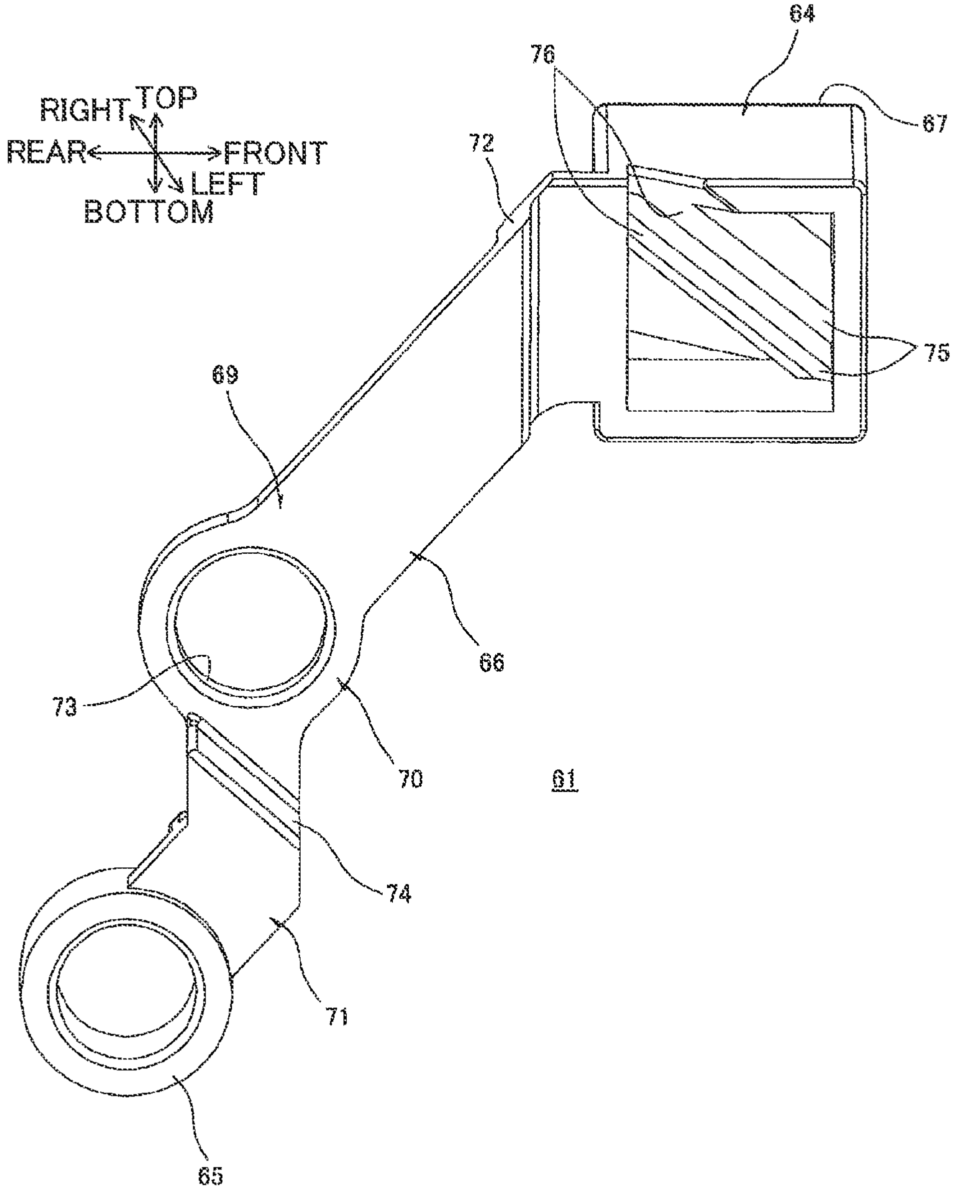
FIG. 5 is a perspective view of a supply electrode as viewed from upper left.

As shown in FIGS. 3 and 5, the supply electrode 61 is formed of a conductive resin material and has a rod-like shape that is elongated in a direction diagonally between the upper front side and the lower rear side as an example of the orthogonal direction. The supply electrode 61 is integrally provided with a supply-side contact part 64 as an example of a contact part, a coupling part 66, and a supply-roller-shaft insertion part 65 as an example of an insertion part.

The supply-side contact part 64 is disposed on the upper front end portion of the supply electrode 61. The supply-side contact part 64 is formed in a square cylindrical shape that has a general rectangular shape in a side view. The supply-side contact part 64 is elongated in the left-right direction with the right end (as an example of a third end portion) closed and the left end (as an example of the first end portion) opened. The right surface of the supply-side contact part 64 is divided into a contact surface 67 and a guide surface 68. A plurality of (two) ribs 75 are provided in the supply-side contact part 64.

The contact surface 67 constitutes the upper half of the right surface on the supply-side contact part 64 and is elongated vertically.

The guide surface 68 constitutes the lower half of the right surface on the supply-side contact part 64 and slopes continuously downward toward the left from the bottom edge of the contact surface 67.

The ribs 75 protrude leftward from the left surface on the right wall of the supply-side contact part 64 and are elongated in a direction angled downward toward the front. Further, the ribs 75 are arranged parallel to each other and are spaced apart in a diagonal direction between the upper front side and the lower rear side. Each of the ribs 75 has a left surface 76 (an example of a sloped surface) that slopes obliquely upward and forward toward the left. The left surfaces 76 of the ribs 75 are provided on the same virtual plane. That is, the virtual plane that is an extended plane of the left surface 76 on the upper front rib 75 is the same virtual plane that is an extended plane of the left surface 76 on the lower rear rib 75.

The coupling part 66 is formed in a plate shape that is bent like a crank and is elongated in a diagonal direction between the upper front side and the lower rear side. More specifically, the coupling part 66 includes a first coupling part 69, a fitting part 70, and a second coupling part 71.

The first coupling part 69 constitutes the upper front half of the coupling part 66. The first coupling part 69 is formed in a rod-like shape and extends diagonally downward and rearward from the left edge on the rear side of the supply-side contact part 64. Here, the upper front end portion of the first coupling part 69 is bent leftward to form a step part 72. The step part 72 is elongated vertically.

The fitting part 70 has a general circular shape in a side view and is provided continuously on the lower rear edge of the first coupling part 69. The fitting part 70 is formed with a supply-side insertion hole 73.

The supply-side insertion hole 73 is penetratingly formed in a general circular shape in a side view and penetrates the radial center region of the fitting part 70. The supply-side insertion hole 73 and the fitting part 70 share the same center. The diameter of the supply-side insertion hole 73 is greater than the outer diameter of the small-diameter part 57 constituting the threaded part 51 and smaller than the outer diameter of the large-diameter part 56. Further, the difference between the diameter of the supply-side insertion hole 73 and the outer diameter of the small-diameter part 57 is greater than the difference between the inner diameter of the supply-roller-shaft insertion part 65 and the outer diameter of the supply-roller shaft A2.

The second coupling part 71 is formed in a bent rod-like shape. More specifically, the second coupling part 71 extends continuously downward from the bottom edge of the fitting part 70, and subsequently bends and extends diagonally downward and rearward at its bottom edge. Here, the second coupling part 71 bends toward the left in a vertical midpoint thereof to form a step part 74. The step part 74 is elongated in a diagonal direction between the upper rear side and the lower front side.

The supply-roller-shaft insertion part 65 is provided on the lower rear end portion of the supply electrode 61 and is formed continuously with the lower rear edge of the second coupling part 71. The supply-roller-shaft insertion part 65 is formed in a general cylindrical shape and is elongated in the left-right direction. The inner diameter of the supply-roller-shaft insertion part 65 is slightly greater than (approximately equal to) the outer diameter of the supply-roller shaft A2.

(2-2) Bearing Member

Figure 7:
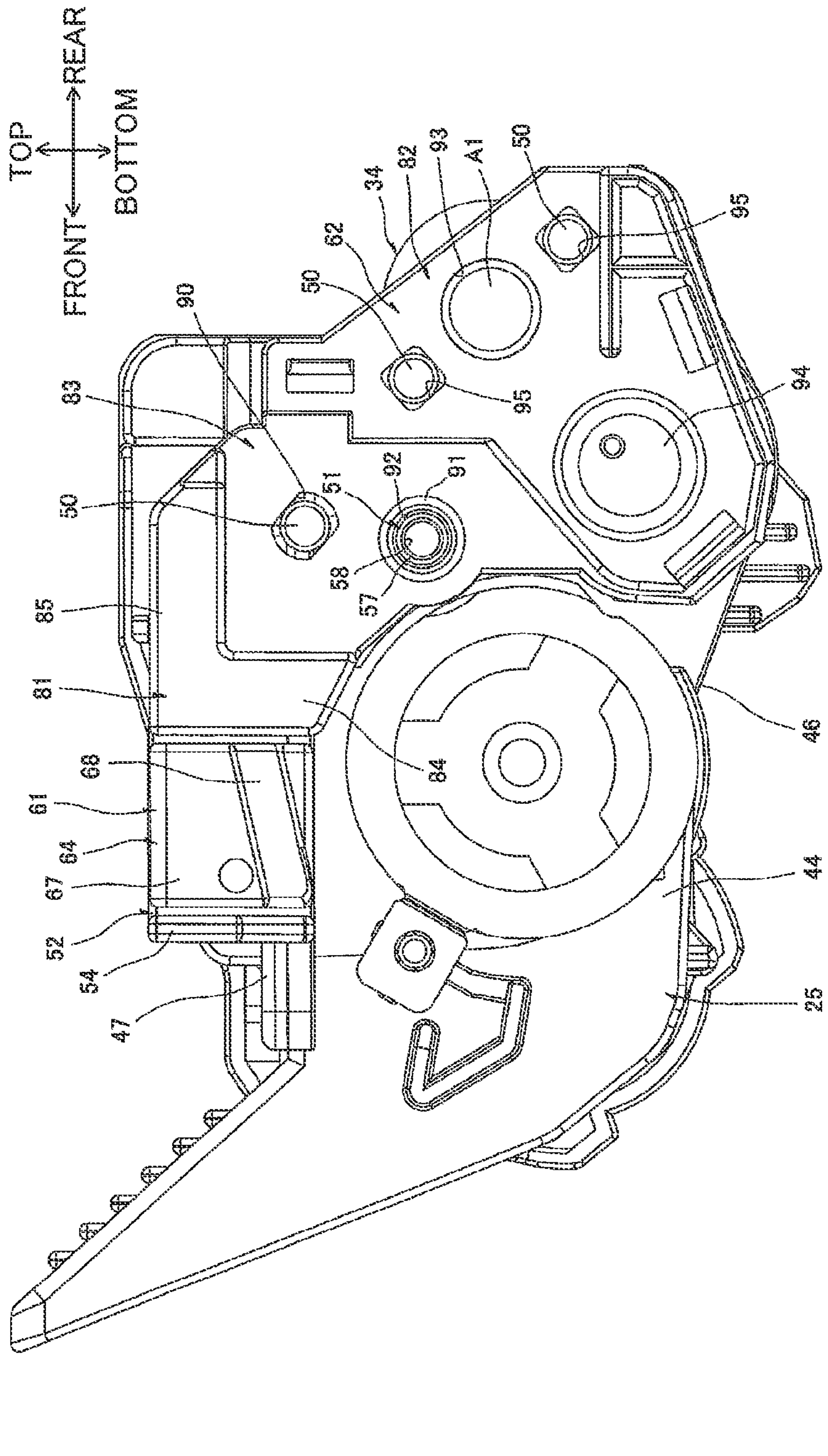
FIG. 7 is a right side view of the developing cartridge in a state where a bearing member is mounted on the cartridge frame shown in FIG. 6.

As shown in FIGS. 3 and 7, the bearing member 62 is formed of an insulating resin material in a plate shape that is generally rectangular in a side view and elongated in a direction diagonally between the upper front side and the lower rear side. The bearing member 62 is integrally provided with an insulating part 81, a fixing part 83, and a bearing part 82.

The insulating part 81 is disposed on the upper front end portion of the bearing member 62. The insulating part 81 is formed in a square cylindrical shape that has a general L-shape in a side view. The insulating part 81 is elongated in the left-right direction and closed on the right end. The insulating part 81 includes a first insulating part 84, and a second insulating part 85.

The first insulating part 84 constitutes the front portion of the insulating part 81. The first insulating part 84 is formed in a general rectangular shape in a side view and is elongated vertically with substantial thickness in the front-rear direction.

The second insulating part 85 constitutes the rear portion of the insulating part 81. The second insulating part 85 is formed in a general rectangular shape in a side view and extends continuously rearward from the top end of the first insulating part 84. The second insulating part 85 has substantial thickness in the vertical direction.

The fixing part 83 is formed in a general plate shape that extends continuously downward and rearward from the left edge on the rear part of the first insulating part 84 and the left edge on the bottom part of the second insulating part 85. The fixing part 83 is formed with a screw insertion hole 89 (indicated by a dashed line in FIG. 3) and a fixing-part-side fitting hole 90. The fixing part 83 is also provided with a screw insertion part 91.

The screw insertion hole 89 is formed in the approximate vertical center region of the bearing member 62. The screw insertion hole 89 has a general circular shape in a side view and penetrates the bearing member 62 in the left-right direction. The screw insertion hole 89 has a larger diameter than the diameters of the large-diameter part 56 and the small-diameter part 57 constituting the threaded part 51.

The fixing-part-side fitting hole 90 is formed in the upper side of the screw insertion hole 89 and penetrates in the left-right direction. The fixing-part-side fitting hole 90 is an elongate hole whose longitudinal dimension extends diagonally between the upper front side and the lower rear side. The dimension of the fixing-part-side fitting hole 90 in a diagonal direction between the lower front side and the upper rear side is slightly greater than (approximately equal to) the outer diameter of the positioning protrusion 50.

The screw insertion part 91 is formed in a general cylindrical shape and protrudes rightward from the peripheral edge of the screw insertion hole 89. The screw insertion part 91 shares a central axis with the screw insertion hole 89. The screw insertion part 91 is in communication with the screw insertion hole 89 at its left end and has an inner diameter equivalent to that of the screw insertion hole 89. The screw insertion part 91 has an inner circumferential surface 92 on which a thread ridge is not formed.

The bearing part 82 is connected to the lower rear end of the fixing part 83. The bearing part 82 is formed in a plate shape having a general rectangular shape in a side view. The bearing part 82 is formed with a developing-roller-shaft insertion hole 93, a plurality of (two) bearing-part-side fitting holes 95, and a supply-roller-shaft insertion hole 96. The fixing part 83 is also provided with a supply-roller-shaft cover part 94.

The developing-roller-shaft insertion hole 93 is formed in the approximate vertical center region on the rear end portion of the bearing part 82. The developing-roller-shaft insertion hole 93 has a general circular shape in a side view and penetrates the bearing part 82 in the left-right direction. The diameter of the developing-roller-shaft insertion hole 93 is slightly larger than (approximately equal to) the outer diameter of the developing-roller shaft A1.

The bearing-part-side fitting holes 95 are provided one each on the lower rear side of the developing-roller-shaft insertion hole 93 and the upper front side of the developing-roller-shaft insertion hole 93. The bearing-part-side fitting holes 95 have a general square shape in a side view. The inner dimensions of the bearing-part-side fitting holes 95 are slightly larger than (approximately equal to) the outer diameter of the positioning protrusion 50.

The supply-roller-shaft insertion hole 96 is formed on the lower front side of the developing-roller-shaft insertion hole 93. The supply-roller-shaft insertion hole 96 has a general circular shape in a side view and penetrates in the left-right direction. The inner diameter of the supply-roller-shaft insertion hole 96 is slightly larger than (approximately equal to) the outer diameter of the supply-roller shaft A2.

The supply-roller-shaft cover part 94 is formed in a general cylindrical shape with the right end closed. The supply-roller-shaft cover part 94 protrudes rightward from the peripheral edge of the supply-roller-shaft insertion hole 96 and shares a central axis with the supply-roller-shaft insertion hole 96. The supply-roller-shaft cover part 94 is in communication with the supply-roller-shaft insertion hole

96 on its left end and has an inner diameter equivalent to the inner diameter of the supply-roller-shaft insertion hole 96.

(2-3) Developing Electrode

As shown in FIGS. 2 and 3, the developing electrode 63 is formed in a plate shape that has a general rectangular shape in a side view and a longitudinal dimension elongated in a direction diagonally between the upper front side and the lower rear side. The developing electrode 63 is formed of a conductive resin material. The developing electrode 63 is integrally provided with a developing-side contact part 101, a fixing part 102, and a developing-roller-shaft fitting part 103.

The developing-side contact part 101 is arranged at the upper front end of the developing electrode 63. The developing-side contact part 101 has a square cylindrical shape that is elongated in the left-right direction and closed on the right end and has a general rectangular shape in a side view. The right surface of the developing-side contact part 101 constitutes a contact surface 104. The contact surface 104 extends in the front-rear and vertical directions.

The fixing part 102 extends continuously downward and rearward from the bottom end of the developing-side contact part 101. The fixing part 102 has a block-like shape with a left-right dimension equivalent to that of the developing-side contact part 101. A screw accommodating part 106 and a guiding surface 105 are formed on the fixing part 102.

The screw accommodating part 106 is a recess formed in the right surface of the fixing part 102 beneath the developing-side contact part 101. The screw accommodating part 106 has a general rectangular shape in a side view and is open on the lower front side. The left-right dimension (depth) of the screw accommodating part 106 is greater than the left-right dimension of the head portion of a screw 110 (described later). The inner dimensions of the screw accommodating part 106 are greater than the diameter of the head portion of the screw 110. A developing-side insertion hole 107 is also formed in the left wall of the screw accommodating part 106.

The developing-side insertion hole 107 is formed in a general circular shape in a side view and penetrates the center region of the left wall constituting the screw accommodating part 106 in the left-right direction. The diameter of the developing-side insertion hole 107 is larger than the outer diameter of the screw insertion part 91 provided on the bearing member 62. Further, the difference between the diameter of the developing-side insertion hole 107 and the outer diameter of the screw insertion part 91 is greater than the difference between the inner diameter of a developing-roller-shaft cover part 108 (described later) and the outer diameter of the developing-roller shaft A1.

The guiding surface 105 is the lower rear portion of the right surface on the fixing part 102 positioned on the lower rear side of the screw accommodating part 106. The guiding surface 105 slopes leftward toward the lower rear side.

The developing-roller-shaft fitting part 103 is formed in a general plate shape and extends continuously rearward from the left end of the fixing part 102. The developing-roller-shaft fitting part 103 is formed with an insertion hole 109 (indicated by a dashed line in FIG. 3). The developing-roller-shaft fitting part 103 is also provided with the developing-roller-shaft cover part 108.

The insertion hole 109 penetrates the developing-roller-shaft fitting part 103 at a position below and rearward of the developing-side insertion hole 107. The insertion hole 109 has a general circular shape in a side view and penetrates the developing-roller-shaft fitting part 103 in the left-right direction. The diameter of the insertion hole 109 is slightly greater than (approximately equal to) the outer diameter of the developing-roller shaft A1.

The developing-roller-shaft cover part 108 is formed in a general cylindrical shape and protrudes rightward from the peripheral edge of the insertion hole 109. The developing-roller-shaft cover part 108 shares a central axis with the insertion hole 109. The developing-roller-shaft cover part 108 is in communication with the insertion hole 109 at its left end and has an inner diameter equal to the inner diameter of the insertion hole 109.

Figure 6:
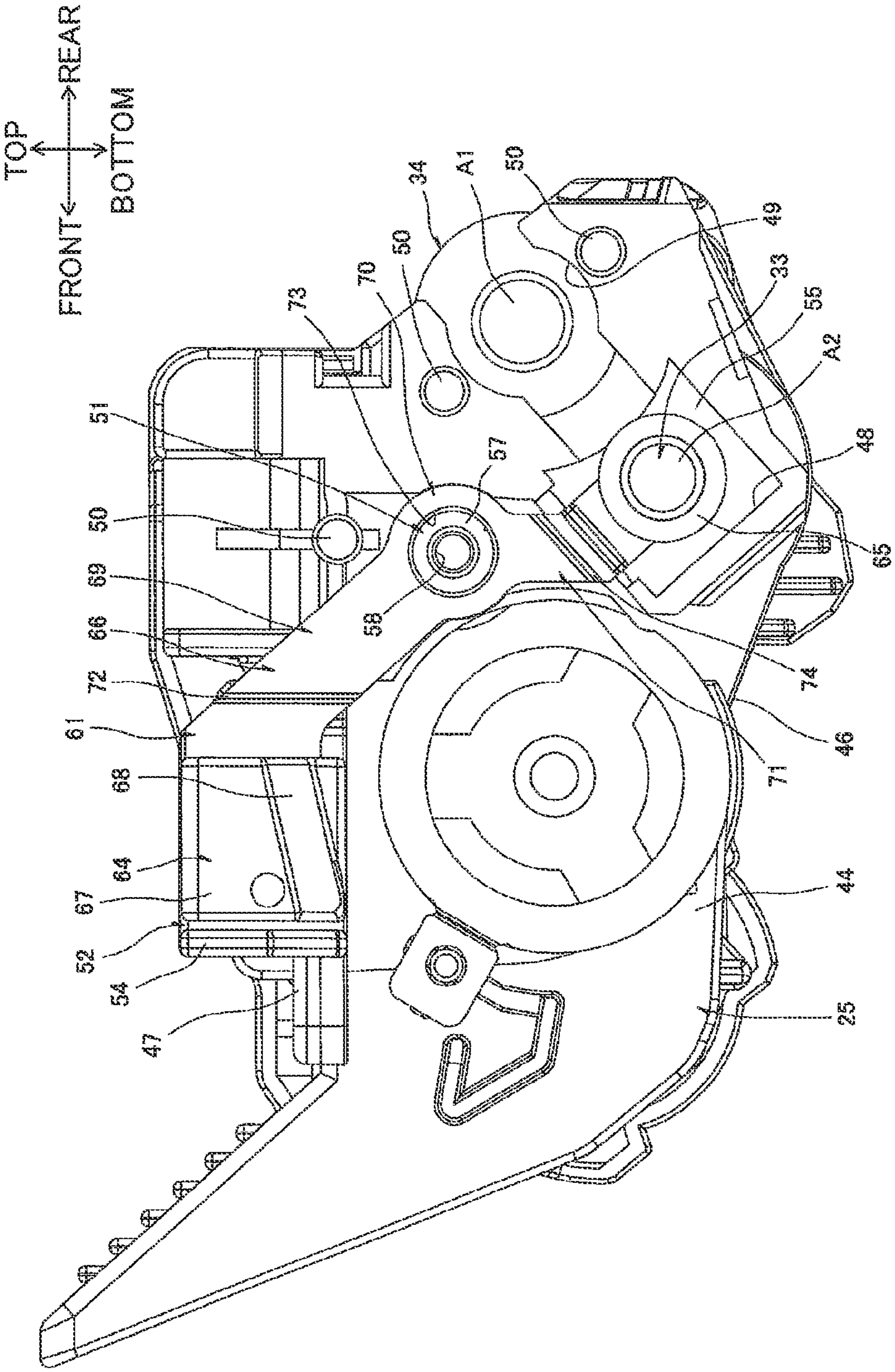
FIG. 6 is a right side view of the developing cartridge in a state where the supply electrode is mounted on the cartridge frame shown in FIG. 4.

(2-4) Assembled State of the Power Supply Unit Relative to the Developer-Cartridge Frame As shown in FIGS. 3 and 6, the supply electrode 61 is supported on the right wall 44 of the developing-cartridge frame 25 such that the supply-side contact part 64 covers the ridges 53 of the supply-electrode opposing part 52 and the supply-roller-shaft insertion part 65 is fitted around the radial outside of the supply-roller shaft A2.

Thus, the supply electrode 61 is electrically connected to the supply-roller shaft A2.

Figure 8:
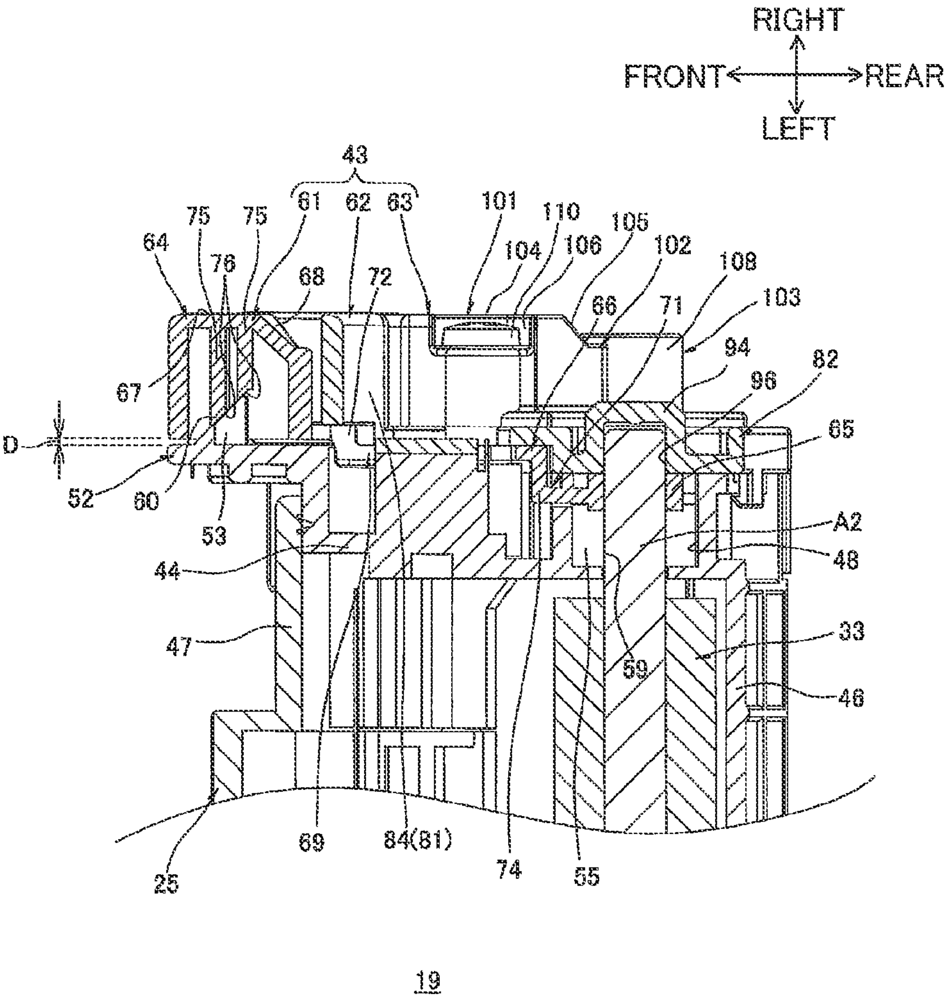
FIG. 8 is a cross-sectional view of the developing cartridge shown in FIG. 2 taken along a line VIII-VIII.

As shown in FIG. 8, the left end of the supply-roller-shaft insertion part 65 is in contact with the right surface of the shaft seal 55. Further, the ribs 75 on the supply-side contact part 64 are in contact at the left surfaces 76 thereof with the right surfaces 60 of the ridges 53.

While not shown in the drawings, the supply-roller-shaft insertion part 65 would be positioned slightly rightward when the supply electrode 61, the bearing member 62, and the developing electrode 63 are not fixed to the developing-cartridge frame 25 than when the same members are fixed to the developing-cartridge frame 25 owing to the elastic force of the shaft seal 55. As a consequence, the coupling part 66 of the supply electrode 61 would slope slightly rightward along a diagonal direction toward the lower rear side.

In addition, as shown in FIG. 6, the small-diameter part 57 of the threaded part 51 is loosely inserted into the supply-side insertion hole 73. The amount of play between the supply-side insertion hole 73 and the small-diameter part 57 of the threaded part 51 is the difference between the diameter of the supply-side insertion hole 73 and the outer diameter of the small-diameter part 57. Further, the supply-side contact part 64 is disposed in confrontation with the rear side of the protection wall 54 constituting the developing-cartridge frame 25, with a gap therebetween. A gap between the supply-side contact part 64 and the protection wall 54 of the developing-cartridge frame 25 is greater than a gap D (FIG. 8) between the left end portion of the supply-side contact part 64 and the right surface of the supply-electrode opposing part 52.

The step part 72 of the first coupling part 69 is disposed on the rear side of the supply-electrode opposing part 52 constituting the developing-cartridge frame 25. Further, the step part 74 of the second coupling part 71 is disposed in the upper front side of the supply-roller-shaft exposing hole 48.

As shown in FIGS. 3 and 7, the bearing member 62 is supported on the right wall 44 of the developing-cartridge frame 25 while covering from the right sides of the supply-roller-shaft insertion part 65 and the coupling part 66 of the supply electrode 61.

The developing-roller shaft A1 is also rotatably inserted through the developing-roller-shaft insertion hole 93. The positioning protrusion 50 positioned on the lower rear side of the developing-roller-shaft exposing hole 49 is fitted into the bearing-part-side fitting hole 95 provided on the lower rear side of the developing-roller-shaft insertion hole 93. The positioning protrusion 50 provided on the upper front side of the developing-roller-shaft exposing hole 49 is fitted into the bearing-part-side fitting hole 95 provided on the upper front side of the developing-roller-shaft insertion hole 93.

In this way, the bearing member 62 is positioned relative to the developing-cartridge frame 25 and rotatably supports the developing roller 34.

Further, the supply-roller shaft A2 is rotatably fitted in the supply-roller-shaft cover part 94. The positioning protrusion 50 disposed above the threaded part 51 is fitted into the fixing-part-side fitting hole 90. Further, the insulating part 81 is disposed in confrontation with the rear side of the supply-side contact part 64 constituting the supply electrode 61 with a gap therebetween. The screw insertion part 91 is disposed in confrontation with the right side of the threaded part 51 such that the interior space of the screw insertion part 91 is in communication with the interior space of the threaded part 51 in the left-right direction.

As shown in FIGS. 2 and 3, the developing electrode 63 is supported on the bearing member 62 so as to cover the fixing part 83 and the upper half of the bearing part 82 from the right side, with the developing-roller-shaft cover part 108 fitted around the developing-roller shaft A1.

The developing-side contact part 101 of the developing electrode 63 is provided on the rear side of the first insulating part 84 and beneath the second insulating part 85. The developing-side contact part 101 confronts the first insulating part 84 and the second insulating part 85 with a gap therebetween.

In this way, the bearing member 62 is interposed between the supply electrode 61 and the developing electrode 63 and insulates the supply electrode 61 and the developing electrode 63 from each other.

With this configuration, the developing electrode 63 is electrically connected to the developing-roller shaft A1 and insulated from the supply electrode 61.

Further, the screw insertion part 91 is inserted into the developing-side insertion hole 107 with play. The amount of play between the developing-side insertion hole 107 and the screw insertion part 91 is equal to the difference between the diameter of the developing-side insertion hole 107 and the outer diameter of the screw insertion part 91. This play between the developing-side insertion hole 107 and the screw insertion part 91 is configured so that the amount of play on the rear side of the screw insertion part 91 is greater than the amount of play on the front side thereof.

The supply electrode 61, the bearing member 62, and the developing electrode 63 are fixed to the developing-cartridge frame 25 by the common screw 110.

More specifically, the screw 110 is inserted through the screw insertion part 91 and screwed into the threaded part 51 of the developing-cartridge frame 25 such that the right half of its shaft is accommodated in the screw insertion part 91, and the left half of its shaft is screwed into the threaded part 51. Further, the bearing surface of the screw 110 is in contact with the right end of the screw insertion part 91 from the right side thereof.

In other words, the screw 110 is only in contact with the screw insertion part 91 and the threaded part 51, and does not contact the developing electrode 63 and the supply electrode 61.

As shown in FIG. 8, the right side of the head of the screw 110 is positioned near (slightly leftward of) the contact surface 104 of the developing-side contact part 101.

Further, the bearing part 82 of the bearing member 62 pushes the supply-roller-shaft insertion part 65 of the supply electrode 61 leftward against the urging force of the shaft seal 55, causing the supply-roller-shaft insertion part 65 to slightly sink into the right side of the shaft seal 55. In this state, the shaft seal 55 urges the supply-roller-shaft insertion part 65 rightward. Further, the coupling part 66 of the supply electrode 61 is now aligned in the front-rear direction.

Further, the left side of the supply-side contact part 64 constituting the supply electrode 61 confronts the right surface of the supply-electrode opposing part 52 with a gap therebetween. The supply electrode 61 has a movable distance in the left-right direction equivalent to the gap D between the left side of the supply-side contact part 64 and the right surface of the supply-electrode opposing part 52. The supply electrode 61 also has a movable distance along a direction angled downward and rearward equivalent to the amount of play between the supply-roller-shaft insertion part 65 and the supply-roller shaft A2.

The gap D between the left side of the supply-side contact part 64 and the right surface of the supply-electrode opposing part 52 is greater than the amount of play between the supply-roller-shaft insertion part 65 and the supply-roller shaft A2. Note that the amount of play between the supply-roller-shaft insertion part 65 and the supply-roller shaft A2 is equivalent to the difference between the inner diameter of the supply-roller-shaft insertion part 65 and the outer diameter of the supply-roller shaft A2.

In other words, the range in which the supply electrode 61 can move in the left-right direction is greater than its range of movement in a diagonal direction between the upper front side and the lower rear side.

3. Main Casing

Figure 9:
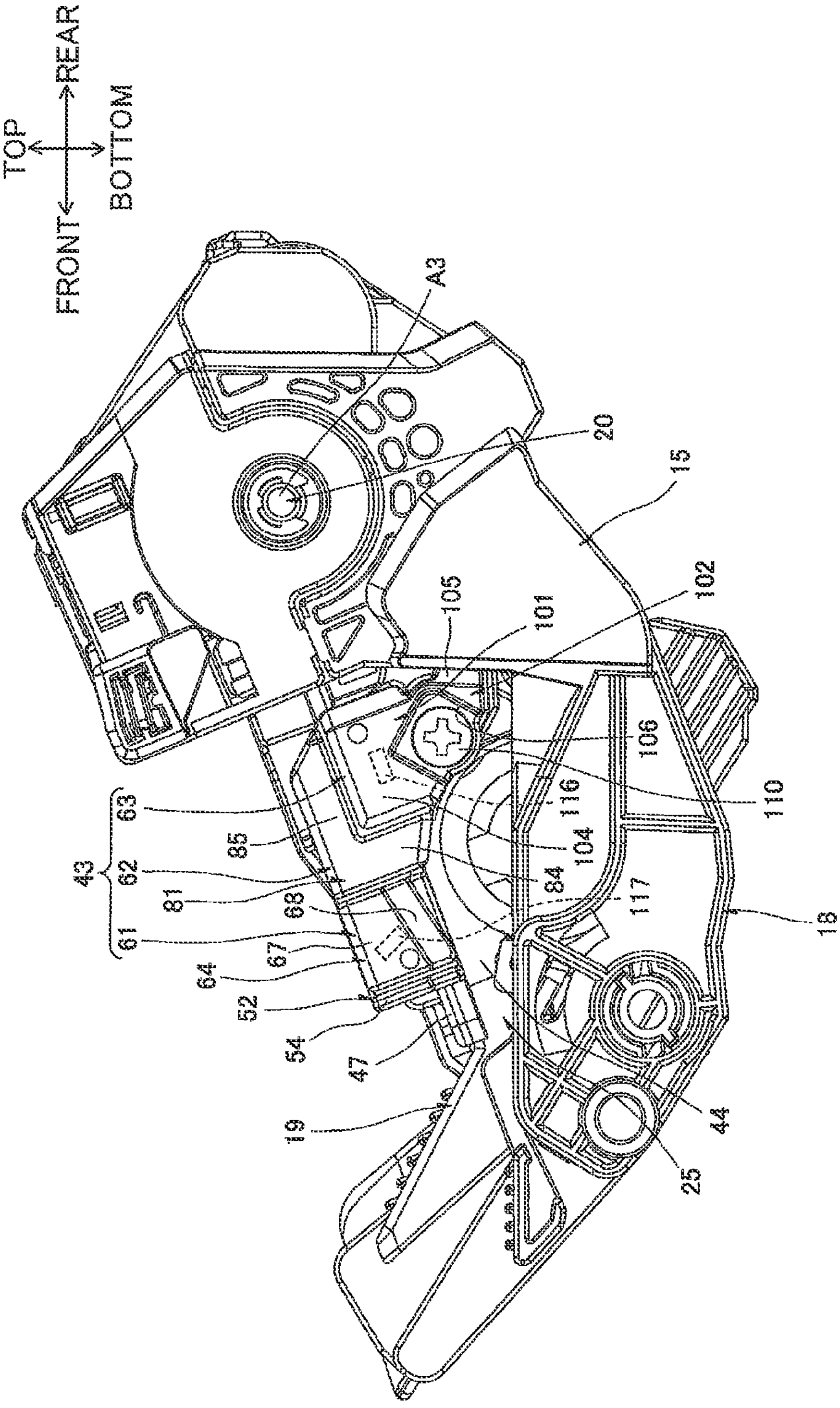
FIG. 9 is a schematic explanation view illustrating a mounting operation of the developing cartridge relative to a drum cartridge, wherein a process cartridge is completely mounted in a main casing.

As depicted in phantom in FIG. 9, a device-side developing electrode 116 and a device-side supply electrode 117 as an example of the external electrode are provided on the inner right wall of a main casing 2.

Directions related to the process cartridge 15 in the following description will be specified based on the orientation of the process cartridge 15 when the process cartridge 15 is mounted in the printer 1 and the printer 1 is resting on a level surface, and specifically will refer to the directions indicated by arrows in FIG. 9.

The device-side developing electrode 116 is provided in the rear section of the main casing 2 and is positioned to contact the contact surface 104 of the developing-side contact part 101 when the process cartridge 15 is completely mounted in the main casing 2. The device-side developing electrode 116 can be displaced in the left and right directions and is constantly urged leftward. The device-side developing electrode 116 is electrically connected to a power supply (not shown) provided in the main casing 2.

The device-side supply electrode 117 is provided on the front side of the device-side developing electrode 116 in the rear section of the main casing 2 and is positioned to contact the contact surface 67 of the supply-side contact part 64 when the process cartridge 15 is completely mounted in the main casing 2. The device-side supply electrode 117 can be displaced in the left and right directions and is constantly urged leftward. The device-side supply electrode 117 is electrically connected to the power supply (not shown) in the main casing 2.

4. Mounting the Process Cartridge in the Main Casing

To mount the process cartridge 15 in the main casing 2, first the operator places the top cover 7 of the main casing 2 in the open position, as illustrated in FIG. 1 and described above.

Next, the operator grips the front end of the process cartridge 15 and inserts the process cartridge 15 into the main casing 2 so that the left and right ends of the drum shaft A3 in the photosensitive drum 20 are fitted into the guide parts 37 of the main casing 2.

Next, the operator pushes the process cartridge 15 diagonally downward and rearward along the guide parts 37 and subsequently rotates the process cartridge 15 counterclockwise in a right side view about the drum shaft A3 of the photosensitive drum 20.

Just before the process cartridge 15 is completely mounted in the main casing 2 as the operator continues to rotate the process cartridge 15, the device-side developing electrode 116 inside the main casing 2 contacts from the lower rear side of the guiding surface 105 on the fixing part 102, and the device-side supply electrode 117 inside the main casing 2 contacts the guide surface 68 on the supply-side contact part 64 from below.

As indicated by a dashed line in FIG. 10, the device-side developing electrode 116 is subsequently displaced rightward against the force urging it leftward as the device-side developing electrode 116 slides along the slope of the guiding surface 105 in a direction diagonally upward and forward relative to the guiding surface 105. Thereafter, the device-side developing electrode 116 slides diagonally upward and forward relative to the screw 110 and comes into contact with the contact surface 104 above the right surface on the head of the screw 110. Since the right surface on the head of the screw 110 is disposed in proximity to (slightly leftward of) the contact surface 104 of the developing-side contact part 101, as described above (see FIG. 8), the device-side developing electrode 116 slides smoothly over the right surface on the head of the screw 110 while contacting the contact surface 104 at this time, without becoming trapped in the screw accommodating part 106. Thus, the device-side developing electrode 116 is electrically connected to the developing electrode 63.

Similarly, the device-side supply electrode 117 is displaced rightward against the force urging it leftward while sliding along the slope of the guide surface 68 in a direction upward relative to the guide surface 68 until coming into contact with the contact surface 67. Through this contact, the device-side supply electrode 117 is electrically connected to the supply electrode 61.

Figure 10:
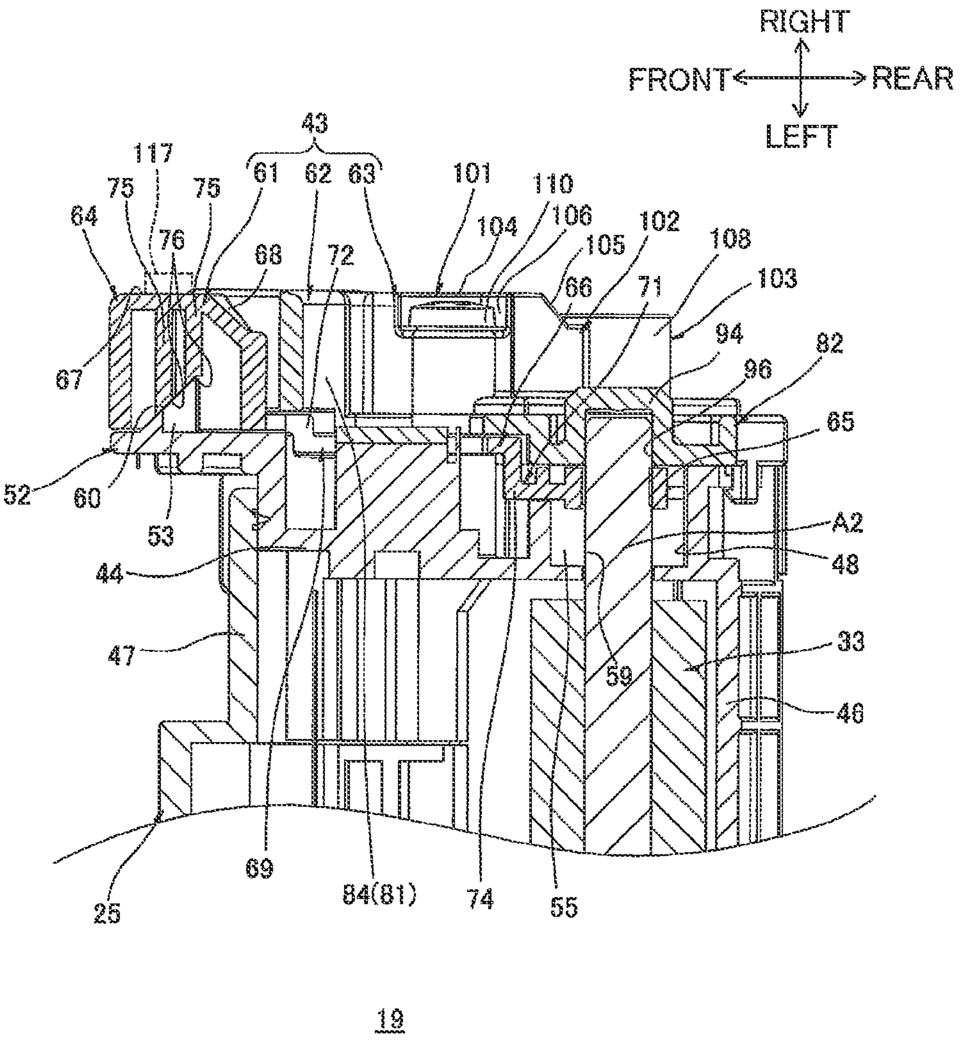
FIG. 10 is a schematic explanation view illustrating a position of an electrode member in a state where the process cartridge is completely mounted in the main casing.

As shown in FIG. 10, the device-side supply electrode 117 pushes the supply-side contact part 64 of the supply electrode 61 leftward at this time.

As a result, the supply-side contact part 64 moves diagonally upward and forward toward leftward, with the left surfaces 76 of the ribs 75 sliding along the sloped right surfaces 60 on the ridges 53 of the developing-cartridge frame 25. In other words, when moving leftward, the supply-side contact part 64 moves away from the supply-roller shaft A2.

As a result, the supply electrode 61 as a whole moves upward and forward along with the movement of the supply-side contact part 64.

Consequently, the supply-roller-shaft insertion part 65 of the supply electrode 61 also moves such that its central axis shifts slightly upward and forward relative to the central axis of the supply-roller-shaft cover part 94.

As a result, the inner surface on the lower rear side of the supply-roller-shaft insertion part 65 contacts the outer surface on the lower rear side of the supply-roller shaft A2.

The process cartridge 15 is completely mounted in the main casing 2 when the drum shaft A3 of the photosensitive drum 20 is disposed in the rear ends of the guide parts 37 and the front end of the process cartridge 15 is positioned beneath the irradiating path of the laser beam L, as illustrated in FIG. 1.

Subsequently, the operator places the top cover 7 of the main casing 2 in the closed position.

When the printer 1 is operated thereafter, power from a power supply (not shown) in the main casing 2 is supplied to the developing-roller shaft A1 sequentially via the device-side developing electrode 116 and the developing electrode 63 and to the supply-roller shaft A2 sequentially via the device-side supply electrode 117 and the supply electrode 61.

To remove the process cartridge 15 from the main casing 2, the operation for mounting the process cartridge 15 described above is performed in reverse on the process cartridge 15 and main casing 2.

That is, after the top cover 7 is placed in the open position, the process cartridge 15 is pulled diagonally upward and forward.

5. Operational Advantages (1) As shown in FIGS. 8 and 10, the developing cartridge 19 described above is capable of moving the supply electrode 61 fitted around the supply-roller shaft A2 in a forward direction at the same time the supply electrode 61 moves leftward upon the contact with the device-side supply electrode 117.

Accordingly, this leftward movement of the supply electrode 61 caused by contact from the device-side supply electrode 117 can be used reliably to place the supply electrode 61 in contact with the rear side of the supply-roller shaft A2.

Thus, this configuration improves the reliability of the electrical connection between the supply electrode 61 and the supply-roller shaft A2.

(2) As shown in FIGS. 8 and 10, the developing cartridge 19 can convert leftward movement of the supply electrode 61 into forward movement through a simple configuration in which the left surfaces 76 of the ribs 75 provided on the supply electrode 61 slide over the right surfaces 60 on the ridges 53 of the developing-cartridge frame 25.

Accordingly, the supply electrode 61 can be moved forward by a simple construction to place the supply electrode 61 in contact with the supply-roller shaft A2.

(3) As shown in FIG. 5, the left surfaces 76 of the ribs 75 provided on the supply electrode 61 are sloped diagonally upward and forward toward leftward.

Accordingly, the left surfaces 76 of the ribs 75 can be moved reliably along the right surfaces 60 on the ridges 53 of the developing-cartridge frame 25.

Hence, this configuration can reliably move the supply electrode 61 upward and forward along the slope of the left surfaces 76.

(4) As shown in FIG. 3, the right surfaces 60 formed on the ridges 53 of the developing-cartridge frame 25 are sloped diagonally downward and rearward toward rightward.

Accordingly, the right surfaces 60 of the ridges 53 can be moved reliably along the left surfaces 76 of the ribs 75 provided on the supply electrode 61.

Consequently, this construction reliably moves the supply electrode 61 diagonally upward and forward along the slope of the right surfaces 60.

(5) As shown in FIGS. 8 and 10, while the supply electrode 61 moves leftward, the supply-side contact part 64 of the supply electrode 61 moves away from the supply-roller shaft A2 in a direction diagonally upward and forward.

This configuration can better prevent the supply-side contact part 64 from bending due to the coupling part 66 rippling in the left-right direction than when the supply-side contact part 64 is moved diagonally downward and rearward to approach the supply-roller shaft A2.

Accordingly, the direction in which the supply electrode 61 moves (the direction from the lower rear side toward the upper front side) can be reliably matched to the direction in which the supply-roller-shaft insertion part 65 contacts the bearing part 82 (the direction from the lower rear side toward the upper front side).

Thus, this construction can more reliably place the supply-roller-shaft insertion part 65 in contact with the supply-roller shaft A2.

(6) As shown in FIGS. 3 and 10, the contact surface 67, which is designed to be contacted by the device-side supply electrode 117, may be formed on the right surface of the supply-side contact part 64.

In this way, the device-side supply electrode 117 can be placed in contact with the right side of the supply-side contact part 64.

Thus, this contact between the device-side supply electrode 117 and the supply-side contact part 64 can be used to move the supply electrode 61 leftward.

(7) As shown in FIGS. 3 and 9, the device-side supply electrode 117 can be guided along the guide surface 68 to be placed smoothly in contact with the contact surface 67.

(8) As shown in FIG. 5, the ribs 75 are formed on the supply-side contact part 64 for contacting the ridges 53 of the developing-cartridge frame 25.

Accordingly, the force with which the device-side supply electrode 117 presses against the supply-side contact part 64 can be transmitted more reliably to the ridges 53 on the developing-cartridge frame 25.

Hence, this configuration can move the supply electrode 61 more reliably in a direction diagonally upward and forward relative to the supply-roller shaft A2.

(9) The developing cartridge 19 described above is also provided with the shaft seal 55 arranged in confrontation with the left side of the supply-roller-shaft insertion part 65.

The elastic force of the shaft seal 55 constantly urges the supply-roller-shaft insertion part 65 rightward and is capable of elastically returning the supply electrode 61 to the right side after the supply electrode 61 is moved to the left side.

Thus, this construction can facilitate access to the supply electrode 61 from the right side.

(10) As shown in FIG. 8, the developing cartridge 19 described above is also provided with the bearing member 62 arranged in opposition to the right side of the supply-roller-shaft insertion part 65. The bearing member 62 pushes the supply-roller-shaft insertion part 65 leftward against the elastic force of the shaft seal 55.

Hence, the supply electrode 61 can be elastically supported between the shaft seal 55 and the bearing member 62.

This construction can move the supply electrode 61 smoothly in a left-right direction and in a direction between the upper front side and lower rear side relative to the supply-roller shaft A2.

Thus, this construction gives the supply-roller-shaft insertion part 65 the ability to follow the supply-roller shaft A2 in order to form a reliable electrical connection between the supply-roller-shaft insertion part 65 and the supply-roller shaft A2.

(11) As shown in FIG. 6, the supply electrode 61 of the developing cartridge 19 is fixed to the developing-cartridge frame 25 with play.

Accordingly, the supply electrode 61 can be moved relative to the supply-roller shaft A2 in a direction between the upper front side and the lower rear side by an amount equivalent to the amount of play between the supply electrode 61 and developing-cartridge frame 25 (and specifically the difference between the diameter of the supply-side insertion hole 73 and the outer diameter of the small-diameter part 57 constituting the threaded part 51).

Hence, through a simple structure, the supply electrode 61 can be moved relative to the supply-roller shaft A2 in a direction between the upper front side and the lower rear side.

(12) As shown in FIGS. 8 and 10, the gap D between the left side of the supply-side contact part 64 and the right surface of the supply-electrode opposing part 52 is greater than the amount of play between the supply-roller-shaft insertion part 65 and the supply-roller shaft A2 (and specifically, the difference between the inner diameter of the supply-roller-shaft insertion part 65 and the outer diameter of the supply-roller shaft A2).

In other words, the supply electrode 61 has a movable distance in the left-right direction greater than a movable distance in a direction between the upper front side and the lower rear side.

Accordingly, the supply electrode 61 always moves between the upper front side and the lower rear side at an amount equivalent to the movable distance along this direction when moved in the left-right direction.

Thus, when the supply electrode 61 is moved in a left-right direction within its range of the movement in this direction, the supply electrode 61 always contacts the supply-roller shaft A2 and, hence, can be reliably placed in contact with the supply-roller shaft A2.

6. Variations of the Embodiment (1) In the embodiment described above, the supply-side insertion hole 73 having a general circular shape in a side view is formed in the fitting part 70 of the supply electrode 61, and the small-diameter part 57 is inserted through the supply-side insertion hole 73 with play.

Figure 11:
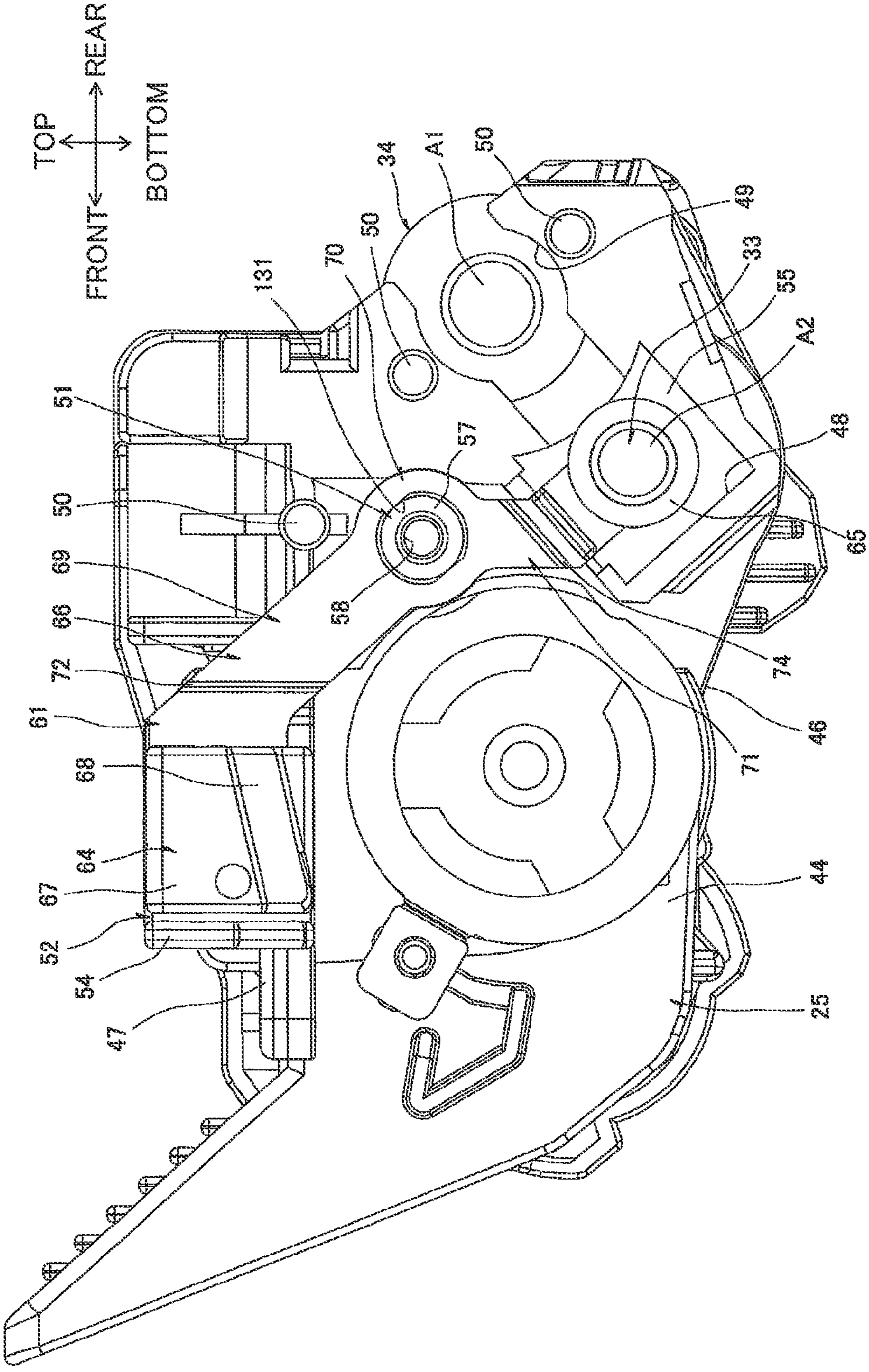
FIG. 11 is a schematic explanation view illustrating a supply electrode according to a modification of the embodiment.

In the variation of the embodiment, a supply-side insertion hole 131 is formed in the fitting part 70. As shown in FIG. 11, the supply-side insertion hole 131 is an elongate hole that is elongated in a direction between the upper front side to the lower rear side.

The inner dimension of the supply-side insertion hole 131 in the direction between the lower front side and upper rear side is approximately equal to the outer diameter of the small-diameter part 57 constituting the threaded part 51. The inner dimension of the supply-side insertion hole 131 in the direction between the upper front side to the lower rear side is slightly larger than the outer diameter of the small-diameter part 57.

The supply-side insertion hole 131 guides the movement of the supply electrode 61 in the direction between the upper front side and the lower rear side. Hence, the supply-side insertion hole 131 functions as the guide portion.

Through the structure of the variation, the supply electrode 61 can be smoothly moved along the direction extending from the upper front side to the lower rear side.

The variation of the embodiment can also obtain the same operational advantages described above in the embodiment.

(2) In the embodiment described above, the supply roller 33 is used as an example of the rotating member capable of carrying developer. Further, the supply electrode 61 that is electrically connected to the supply roller 33 is capable of moving in a direction between the upper front side and the lower rear side (a direction orthogonal to the axial direction of the supply-roller shaft A2).

However, the rotating member of the invention is not particularly restricted to the supply roller 33, provided that the rotating member can carry developer. For example, the developing roller 34 may serve as an example of the rotating member, and the developing electrode 63 electrically connected to the developing roller 34 may be configured to move along a direction from the upper front side to the lower rear side (a direction orthogonal to the axial direction of the developing-roller shaft A1).

This variation can also obtain the same operational advantages described above in the embodiment.

(3) The printer 1 described above is an embodiment for the image-forming device of the present invention, but the present invention is not limited to this embodiment. For example, in the embodiment described above the right surfaces 60 of the ridges 53 are formed on the developing-cartridge frame 25 side while the left surfaces 76 of the ribs 75 are formed on the supply electrode 61 side. However, it is possible to form either just the right surfaces 60 on the developing-cartridge frame 25 or just the left surfaces 76 on the supply electrode 61 rather than both.

In addition to the monochrome printer described above, the image-forming device of the present invention may be configured as a color printer.

When configured as a color printer, the image-forming device may be configured as a direct tandem color printer provided with a plurality of photosensitive bodies and a recording medium conveying member; or may be configured as an intermediate transfer tandem color printer provided with a plurality of photosensitive bodies, an intermediate transfer body, and a transfer member.

In addition to the separable process cartridge 15 that allows the drum cartridge 18 and the developing cartridge 19 to be separated from each other, as described above, the process cartridge 15 may be an integrated unit in which the drum cartridge 18 and the developing cartridge 19 are integrally provided.

It is also possible to provide the photosensitive drum 20 in the main casing 2, while enabling only the developing cartridge 19 to be mounted in and removed from the main casing 2.

Further, in place of the photosensitive drum 20 described above, a photosensitive belt or other member may be used as the photosensitive body.

Similarly, instead of the developing roller 34 described above, a developing sleeve, a developing belt, a brush roller, or other device may be used as the developer-carrying body.

Further, instead of the supply roller 33 described above, a supply sleeve, a supply belt, a brush roller, or other member may be used as the supply member.

Further, instead of the agitator 29 described above, an auger screw, a conveying belt, or another member may be used as the conveying member.

Further, instead of the transfer roller 21 described above, a contact-type transfer member such as a transfer belt, a transfer brush, a transfer blade, and a film-like transfer device, or a non-contact-type transfer member such as a corotron-type transfer member may be used as the transfer member.

Further, instead of the scorotron charger 22 described above, a non-contact-type charger such as a corotron-type charger and a charger provided with a sawtooth discharge member, or a contact-type charger such as a charging roller may be used as the charger.

Further, instead of the scanning unit 16 described above, an LED unit or the like may be used as the exposure member.

The image-forming device of the present invention may also be configured as a multifunction peripheral that is equipped with an image-reading unit and the like.

While the developing electrode 63 described above is formed of a conductive resin material, the developing electrode 63 may instead be formed of metal. The supply electrode 61 may be similarly formed of metal.

While the bearing member 62 described above is formed of an insulating resin material, the bearing member 62 may instead be formed of an insulating rubber. Further, while the bearing member 62 described above rotatably supports both the developing-roller shaft A1 and the supply-roller shaft A2, the bearing member 62 may be configured to rotatably support only one of these shafts.

Conductive grease may be added between the supply-roller-shaft insertion part 65 and the supply-roller shaft A2, and between the insertion hole 109 and the developing-roller shaft A1.

What is claimed is:

1. A cartridge comprising:

a housing configured to accommodate developer therein;

a developing roller rotatable about a developing axis extending in a first direction;

a first electrode made of conductive resin, the first electrode being positioned at one side of the housing in the first direction, the first electrode being electrically connected to the developing roller, the first electrode including a first electrical contact extending in the first direction;

a second electrode made of conductive resin, the second electrode being positioned at the one side of the housing in the first direction, the second electrode being electrically connected to a component of the cartridge, the second electrode including a second electrical contact extending in the first direction, the second electrical contact being separated from the first electrical contact in a second direction crossing the first direction; and a plate made of insulating resin, the plate being positioned at the one side of the housing in the first direction, the plate extending in the first direction, the plate being positioned between the first electrical contact and the second electrical contact in the second direction.

2. The cartridge according to claim 1, wherein the plate is interposed between the first electrical contact and the second electrical contact in the second direction.

3. The cartridge according to claim 1, wherein the plate includes one end portion and another end portion separated from the one end portion in the second direction, wherein the first electrical contact faces the one end portion of the plate in the second direction, and wherein the second electrical contact faces the another end portion of the plate in the second direction.

4. The cartridge according to claim 3,
wherein the first electrical contact contacts the one end portion of the plate in the second direction, and
wherein the second electrical contact contacts the another end portion of the plate in the second direction.

5. The cartridge according to claim 1,
wherein the developing roller includes a developing roller shaft, and
wherein the first electrode is electrically connected to the developing roller shaft.

6. The cartridge according to claim 5,
wherein the developing roller shaft is inserted through the first electrode.

7. The cartridge according to claim 1,
wherein the first electrical contact is positioned closer to the second electrical contact than the developing roller is to the second electrical contact.

8. The cartridge according to claim 1,
wherein the component is a supply roller rotatable about a second axis extending in the first direction, and
wherein the second electrode is electrically connected to the supply roller.

9. The cartridge according to claim 1,
wherein the first electrical contact extends away from another side of the housing in the first direction.

10. The cartridge according to claim 1,
wherein the second electrical contact extends away from another side of the housing in the first direction.

11. The cartridge according to claim 1,
wherein the plate extends away from another side of the housing in the first direction.

12. The cartridge according to claim 1,
wherein the housing has a first outer surface and a second outer surface spaced apart from the first outer surface in the first direction,
wherein the first electrical contact is positioned at the first outer surface,
wherein the second electrical contact is positioned at the first outer surface, and
wherein the plate is positioned at the first outer surface.

13. The cartridge according to claim 1,
wherein the first electrical contact is contactable with a first apparatus electrode in a state where the cartridge is attached to an image forming apparatus, and
wherein the second electrical contact is contactable with a second apparatus electrode in a state where the cartridge is attached to the image forming apparatus.

14. The cartridge according to claim 1, further comprising:
a photosensitive drum rotatable about a drum axis extending in the first direction.

15. The cartridge according to claim 14,
wherein the developing roller contacts the photosensitive drum in a state where the cartridge is attached to an image forming apparatus.

* * * * *